(12) United States Patent
Shibazaki

(10) Patent No.: US 8,964,166 B2
(45) Date of Patent: Feb. 24, 2015

(54) STAGE DEVICE, EXPOSURE APPARATUS AND METHOD OF PRODUCING DEVICE

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1006 days.

(21) Appl. No.: 12/314,745

(22) Filed: Dec. 16, 2008

(65) Prior Publication Data

US 2009/0207394 A1 Aug. 20, 2009

Related U.S. Application Data

(60) Provisional application No. 61/006,731, filed on Jan. 29, 2008.

(30) Foreign Application Priority Data

Dec. 17, 2007 (JP) ................ P2007-325076

(51) Int. Cl.
*G03B 27/62* (2006.01)
*G03B 27/52* (2006.01)
*G03B 27/58* (2006.01)
*G03F 7/20* (2006.01)

(52) U.S. Cl.
CPC ............ *G03F 7/70875* (2013.01); *G03F 7/707* (2013.01)
USPC ................... 355/75; 355/30; 355/72

(58) Field of Classification Search
USPC ............ 355/53, 67, 77, 72, 75, 76, 30
See application file for complete search history.

(56) References Cited

U.S. PATENT DOCUMENTS

| | | | |
|---|---|---|---|
| 4,864,360 A | | 9/1989 | Isohata et al. |
| 5,559,584 A | * | 9/1996 | Miyaji et al. ............ 355/73 |
| 5,877,843 A | * | 3/1999 | Takagi et al. ............ 355/30 |
| 6,208,407 B1 | | 3/2001 | Loopstra |
| 6,262,796 B1 | | 7/2001 | Loopstra et al. |
| 6,341,007 B1 | | 1/2002 | Nishi et al. |
| 6,400,441 B1 | | 6/2002 | Nishi et al. |
| 6,549,269 B1 | | 4/2003 | Nishi et al. |
| 6,555,834 B1 | * | 4/2003 | Loopstra ............ 250/492.3 |
| 6,590,634 B1 | | 7/2003 | Nishi et al. |
| 6,611,316 B2 | | 8/2003 | Sewell |
| 6,704,088 B2 | * | 3/2004 | Tanimoto ............ 355/30 |
| 6,778,257 B2 | | 8/2004 | Bleeker et al. |
| 6,897,963 B1 | | 5/2005 | Taniguchi et al. |
| 6,933,513 B2 | * | 8/2005 | Van Empel et al. ...... 250/492.3 |

(Continued)

FOREIGN PATENT DOCUMENTS

| | | |
|---|---|---|
| EP | 1 713 113 A1 | 10/2006 |
| JP | A-61-247025 | 11/1986 |

(Continued)

OTHER PUBLICATIONS

Written Opinion dated Jul. 1, 2011 in Singaporean Patent Application No. 201004297-6.

(Continued)

*Primary Examiner* — Deoram Persaud
(74) *Attorney, Agent, or Firm* — Oliff PLC

(57) ABSTRACT

A stage device is provided with a mobile body retaining a mask illuminated with exposure light and moving along a predetermined plane, and a flow control section moving substantially together with the movement of the mobile body so as to control the flow of gas in proximity to the mask thereby.

70 Claims, 9 Drawing Sheets

(56) References Cited

U.S. PATENT DOCUMENTS

| | | |
|---|---|---|
| 7,023,610 B2 | 4/2006 | Ohtsuki et al. |
| 7,130,016 B2 * | 10/2006 | Miyajima ................. 355/30 |
| 2001/0026355 A1 | 10/2001 | Aoki et al. |
| 2001/0055101 A1 * | 12/2001 | Hayashi ................... 355/53 |
| 2002/0145711 A1 * | 10/2002 | Magome et al. .......... 355/30 |
| 2005/0248744 A1 | 11/2005 | Shibazaki |

FOREIGN PATENT DOCUMENTS

| | | |
|---|---|---|
| JP | A-9-55355 | 2/1997 |
| JP | A-2002-260998 | 9/2002 |
| JP | A-2002-280284 | 9/2002 |
| JP | A-2004-214552 | 7/2004 |
| JP | A-2007-324168 | 12/2007 |
| WO | WO 99/49504 A1 | 9/1999 |

OTHER PUBLICATIONS

International Search Report dated Jan. 27, 2009 in International Application No. PCT/JP2008/072941 (with translation).

Written Opinion of the International Searching Authority dated Jan. 27, 2009 in International Application No. PCT/JP2008/072941 (with translation).

Written Opinion dated Jun. 2, 2011 in Hungarian Patent Application No. 201004297-6.

* cited by examiner

DIRECTION OF MOVEMENT

STAGE DEVICE, EXPOSURE APPARATUS AND METHOD OF PRODUCING DEVICE

CROSS-REFERENCE TO RELATED APPLICATION

This application is a non-provisional application claiming priority to and the benefit of U.S. provisional application No. 61/006,731, filed Jan. 29, 2008, and claims priority to Japanese Patent Application No. 2007-325076, filed Dec. 17, 2007. The entire contents of which are incorporated herein by reference.

BACKGROUND

1. Field of the Invention

The invention relates to a stage device, an exposure apparatus and a method of producing a device.

2. Related Art

An exposure apparatus used in a photolithography process illuminates a mask with exposure light in order to expose a substrate with exposure light transmitting through a mask. As disclosed in U.S. Patent Application Publication No. 2005/0248744, the exposure apparatus is provided with a mask stage retaining and moving the mask and a substrate stage retaining and moving the substrate.

A temperature change on the mask caused by illumination of exposure light for example may result in exposure defects. For example, when the illumination of exposure light causes a temperature increase and thermal deformation in the mask, the pattern image of the mask distorts and reduces the overlay accuracy of the pattern on the substrate. Consequently there is the possibility of exposure defects such as the production of flaws in the pattern formed on the substrate. As a result, defective devices may be produced.

An aspect of the present invention is to provide a stage device that can suppress temperature change on a mask. Another aspect of the present invention is to provide an exposure apparatus that suppress the production of exposure defects. Yet another aspect of the present invention is to provide a method of producing devices enabling suppression of the production of defective devices.

SUMMARY

According to a first aspect of the present invention, there is provided a stage device that includes a mobile body retaining a mask illuminated by exposure light and moving along a predetermined plane, and a flow control section moving substantially together with the movement of the mobile body to thereby control the flow of gases in proximity to the mask.

According to a second aspect of the present invention, there is provided a stage device that includes a mobile member having a retaining section for retaining a mask illuminated by exposure light, the mobile member retaining the mask and moving along a predetermined plane including the illumination position of the exposure light; and an intake structure including an intake port taking in gas, a first gas passage enabling flow of gases from the intake port and a supply port supplying gases flowing from the first gas passage to a surface of the mask retained on the retaining section.

According to a third aspect of the present invention, there is provided a stage device that includes a mobile member having a retaining section for retaining a mask illuminated by exposure light, the mobile member retaining the mask and moving along a predetermined plane including the illumination position of the exposure light; and an outlet structure including an inflow port into which flows at least a part of the gases flowing across the surface of the mask, a second gas passage enabling flow of gases from the inflow port and a outlet port discharging gases flowing from the second gas passage.

According to a fourth aspect of the present invention, there is provided an exposure apparatus that illuminates a mask with exposure light and exposes a substrate with exposure light through the mask, the exposure apparatus provided with the stage device according to the first, second or third aspects.

According to a fifth aspect of the present invention, there is provided a method of producing a device, the method includes exposing a substrate using the exposure apparatus according to the fourth aspect, and developing an exposed substrate.

According to the aspects of the invention, temperature change in a mask can be suppressed. Furthermore according to the aspects of the invention, the occurrence of exposure defects can be suppressed. Yet further according to the aspects of the invention, the production of defective devices can be suppressed.

DESCRIPTION OF EMBODIMENTS

Although the embodiments of the invention will be described hereafter making reference to the accompanying figures, the invention is not limited thereby. In the description hereafter, an XYZ orthogonal coordinate system is determined and the positional relationship of respective members is described making reference to the XYZ orthogonal coordinate system. The X axis direction is a predetermined direction in a horizontal plane, the Y axis direction is a direction which is orthogonal to the X-axis direction in the horizontal plane and the Z axis direction is a direction which is orthogonal respectively to the X-axis direction and the Y-axis direction (in other words, it is the vertical direction). The rotational (inclination) direction about the X axis, Y axis and Z axis is denoted respectively $\theta x$, $\theta Y$, and $\theta Z$ directions.

First Embodiment

Figure 1:
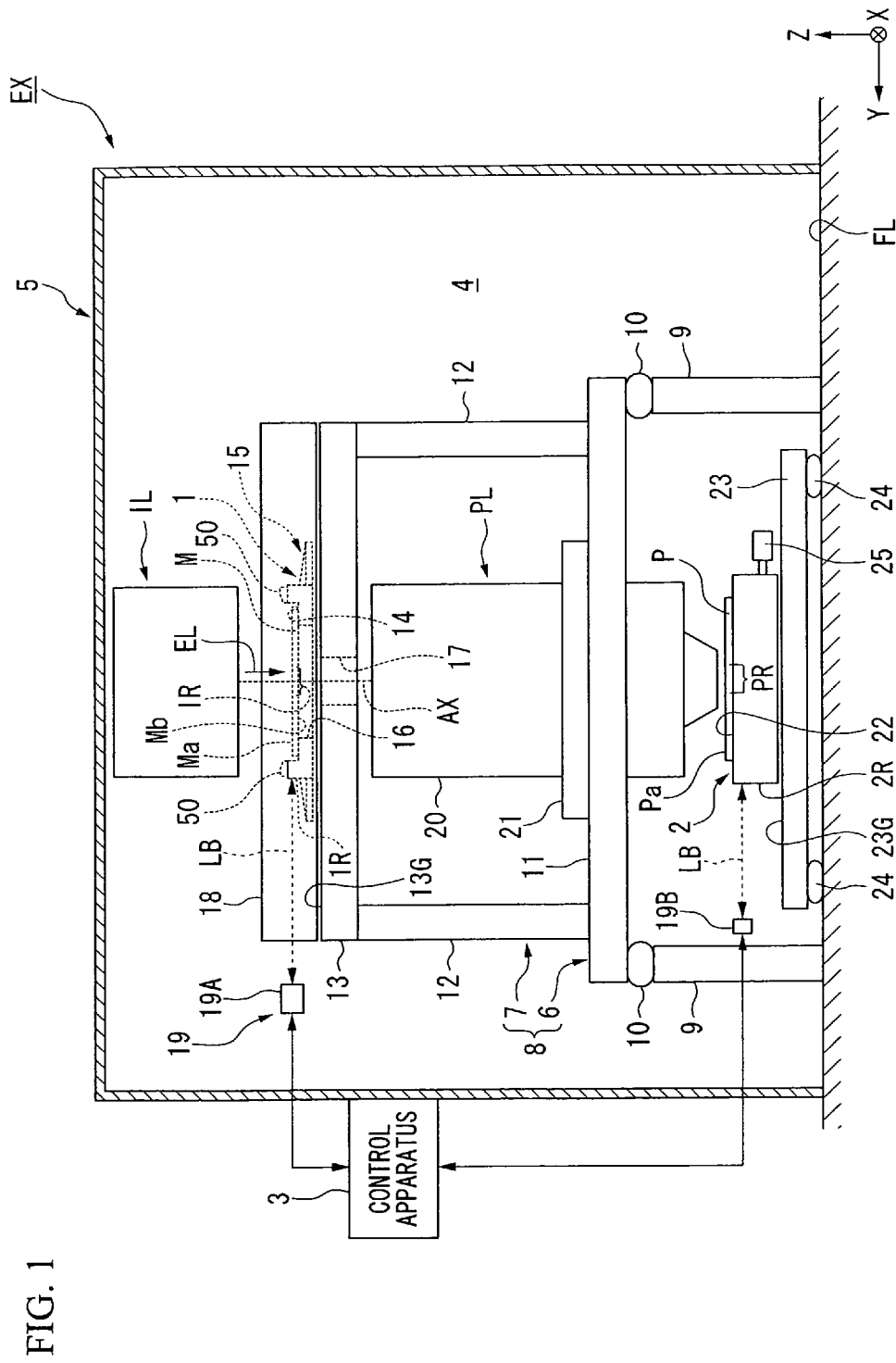
FIG. 1 is a schematic view showing an example of an exposure apparatus according to a first embodiment.

A first embodiment will be described hereafter. FIG. 1 is a schematic view showing an example of an exposure apparatus EX according to the first embodiment. In FIG. 1, the exposure apparatus EX is provided with a mask stage retaining and moving a mask M, a substrate stage 2 retaining and moving a substrate P, an illumination system IL illuminating the mask M retained on the mask stage 1 with exposure light EL, a projection optical system PL projecting an image pattern of the mask M illuminated by exposure light EL onto the substrate P retained on the substrate stage 2, and a control apparatus 3 controlling the overall operation of the exposure apparatus EX. The control apparatus 3 includes for example a computer system. The exposure apparatus EX includes a chamber apparatus 5 forming an inner space 4 in which the substrate P is processed. The chamber apparatus 5 can regulate the environment of the inner space 4 (temperature, humidity and cleanliness level).

The substrate P is a substrate for producing a device which for example includes devices forming a photosensitive layer on a base of a semiconductor wafer such as a silicon wafer. The photosensitive layer is a layer of a photosensitive material (photoresist). Furthermore various types of layers including protective layers (top coat layer) may be formed over the photosensitive layer on the substrate P.

The mask M includes reticles forming device patterns which are projected onto the substrate P. In the embodiment, the mask M is a light-transmission mask with a predetermined pattern forming using a light shielding film such as chrome on a transparent plate such as glass. The light-transmission mask is not limited to a binary mask on which a pattern is formed using a shield layer and may for example include a halftone mask or a phase-shift mask of a spatial-frequency modulation type for example. In the embodiment, although a light-transmission mask is used as the mask M, a reflective mask may be used.

The exposure apparatus EX according to this embodiment is a scan type exposure apparatus (a so-called scanning stepper) which moves the mask M and the substrate P synchronously in a predetermined scanning direction and exposes the substrate P with exposure light EL transmitting through the mask M. In the embodiment, the scanning direction of the substrate P (direction of synchronous movement) is taken to be the Y axis direction and the scanning direction of the mask M (direction of synchronous movement) is also taken to be the Y axis direction. The exposure apparatus EX illuminates the mask M with exposure light EL as the substrate P moves in the Y axis direction with respect to a projection region PR of the projection optical system PL and, synchronously with the movement of the substrate P in the Y axis direction, the mask M moves in the Y axis direction relative to an illuminated region IR of the illumination system IL. Consequently exposure light EL from the mask M illuminates the substrate P through the projection optical system PL. The illumination region IR of the illumination system IL includes an illumination position for exposure light EL emitted from the illumination system IL. The projection region PR of the projection optical system PL includes an illumination position of exposure light EL emitted from the projection optical system PL.

The exposure apparatus EX includes a first column 6 that is for example provided on a floor face FL in a cleanroom and a body 8 that includes a second column 7 provided on the first column 6. The first column 6 has a plurality of first support columns 9 and a first plate 11 supported via a vibration isolator 10 on the first support columns 9. The second column 7 has a plurality of second support columns 12 provided on the first plate 11 and a second plate 13 supported on the second support columns 12.

The illumination system IL illuminates a predetermined illumination region IR with exposure light EL having a uniform illumination intensity distribution. The mask M can move within the illumination region IR (illumination position for exposure light EL) in the illumination system IL. The illumination system IL illuminates at least a part of the mask M disposed in the illumination region IR with exposure light EL having a uniform illumination intensity distribution. Exposure light EL emitted from the illumination system IL may include deep-ultraviolet light (DUV light) such as emission lines (g line, h line, i line) emitted from a mercury lamp and light from a KrF excimer laser (wavelength 248 mm), or vacuum ultraviolet light (DUV light) such as ArF excimer laser light (wavelength 193 nm) or $F_2$ laser light (wavelength 157 nm). In the embodiment, as the exposure light EL, Arf excimer laser light which is ultraviolet light (vacuum ultraviolet light) is used.

The mask stage 1 has a mask retaining section 14 that retains a mask M illuminated with exposure light EL. The mask retaining section 14 allows for attachment and detachment of the mask M. In the embodiment, the mask retaining section 14 retains the mask M so that the lower face of the mask M (pattern forming face) and the XY plane are substantially parallel. The mask stage 1 is non-contact supported on the upper face (guide face) 13G of the second plate 13 by a gas bearing. In the embodiment, the upper face 13G of the second plate 13 and the XY plane are substantially parallel. The operation of a mask stage drive device 15 including an actuator such as a linear motor enables the mask stage 1 to retain and move a mask M along the upper face 13G of a second plate 13 including an illumination position (illumination region IR of the illumination system IL) for exposure light EL emitted from the illumination system IL. In the embodiment the mask stage 1 can move in the three directions of the X axis, the Y axis and the θZ directions on the second plate 13 with the mask M retained on the mask retaining section 14. The mask stage 1 has a first aperture 16 allowing passage of exposure light EL for example during exposure of the substrate P or during measurement using exposure light EL. The second plate 13 has a second aperture 17 allowing passage of exposure light EL. The exposure light EL emitted from the illumination system IL and illuminating the mask M passes through the first aperture 16 and the second aperture 17 and enters the projection optical system PL.

A counter mass 18 is provided on the second plate 13 and moves in a direction (for example, the −Y direction) opposite to the mask stage 1 in response to the movement of the mask stage 1 in one Y-axis direction (for example the +Y direction). The counter mass 18 is non-contact supported on an upper face 13G of the second plate 13 by a weight canceling mechanism including an air pad. According to this embodiment, the counter mass 18 is provided on the periphery of the mask stage 1.

Positional information of the mask stage 1 (mask M) is measured using a laser interferometer 19A in an interferometer system 19. The laser interferometer 19A illuminates measuring light LB onto the reflective face 1R of the mask stage 1. The laser interferometer 19A measures positional information of the mask stage 1 relative to the X axis, the Y axis and the θZ directions using measuring light LB illuminated onto the reflective face 1R of the mask stage 1. A control apparatus 3 operates the mask stage drive device 15 based on the measurement results of the interferometer system 19 (laser interferometer 19A) to perform positional control of the mask M retained on the mask stage 1.

The projection optical system PL illuminates exposure light EL onto a predetermined projection region PR. The substrate P can move in the projection region (the illumination position for exposure light EL) of the projection optical system PL. The projection optical system PL projects a pattern image of the mask M at a predetermined projection magnification onto at least a section of the substrate P disposed on the illumination region PR. A plurality of optical elements of the projection optical system PL is retained in a lens barrel 20. The lens barrel 20 has a flange 21. The flange 21 is supported on the first plate 11. In the embodiment the projection optical system PL is a reduction system whose projection factor is, for example, ¼, ⅕, or ⅛ or the like. The projection optical system PL may employ an equal system or an enlarging system. In the embodiment the optical axis AX of the projection optical system PL is parallel to the Z axis direction. The projection optical system PL can be either a dioptric system that does not include any catoptric elements, a catoptric system that does not include any dioptric elements, or a catadioptric system that includes both catoptric elements and dioptric elements. The projection optical system PL can form either an inverted image or an erect image.

The substrate stage 2 has a substrate retaining section 22 retaining a substrate P which is illuminated with exposure light EL. The substrate retaining section 22 enables attachment and detachment of the substrate P. In the embodiment the substrate retaining section 22 retains the substrate P so that the exposure face (upper face) Pa of the substrate P and the XY plane are substantially parallel. The substrate stage 2 is non-contact supported on the upper face (guide face) 23G of the third plate 23 by a gas bearing. In the embodiment, the upper face 23G of the third plate 23 and the XY plane are substantially parallel. The third plate 23 is supported on the floor face FL by a vibration isolator 24. The operation of a substrate stage drive device 25 including an actuator such as a linear motor enables the substrate stage 2 to retain and move a substrate P along the upper face 230 of the third plate 23 including an illumination position (projection region PR of the projection optical system PL) of exposure light EL emitted from the projection optical system PL. In the embodiment, the substrate stage 2 can move in the six directions given by the X axis, the Y axis, Z axis, and θX, θY and θZ directions on the third plate 23 with the substrate P retained on the substrate retaining section 22.

Positional information of the substrate stage 2 (substrate P) is measured using a laser interferometer 19B in an interferometer system 19. The laser interferometer 19B illuminates measuring light LB onto the reflective face 2R of the substrate stage 2. The laser interferometer 19B measures positional information of the substrate stage 2 relative to the X axis, the Y axis and the θZ directions using the measuring light LB illuminated onto the reflective face 2R of the substrate stage 2. Surface positional information (positional information relating to the Z axis, θX and θY directions) of the exposure face Pa of the substrate P retained on the substrate stage 2 is detected using a focus leveling detection system (not shown). The control apparatus 3 operates a substrate stage drive device 25 based on the measurement results of the interferometer system 19 (laser interferometer 19B) and the detection results of the focus leveling detection system to perform positional control of the substrate P retained on the substrate stage 2.

Figure 2:
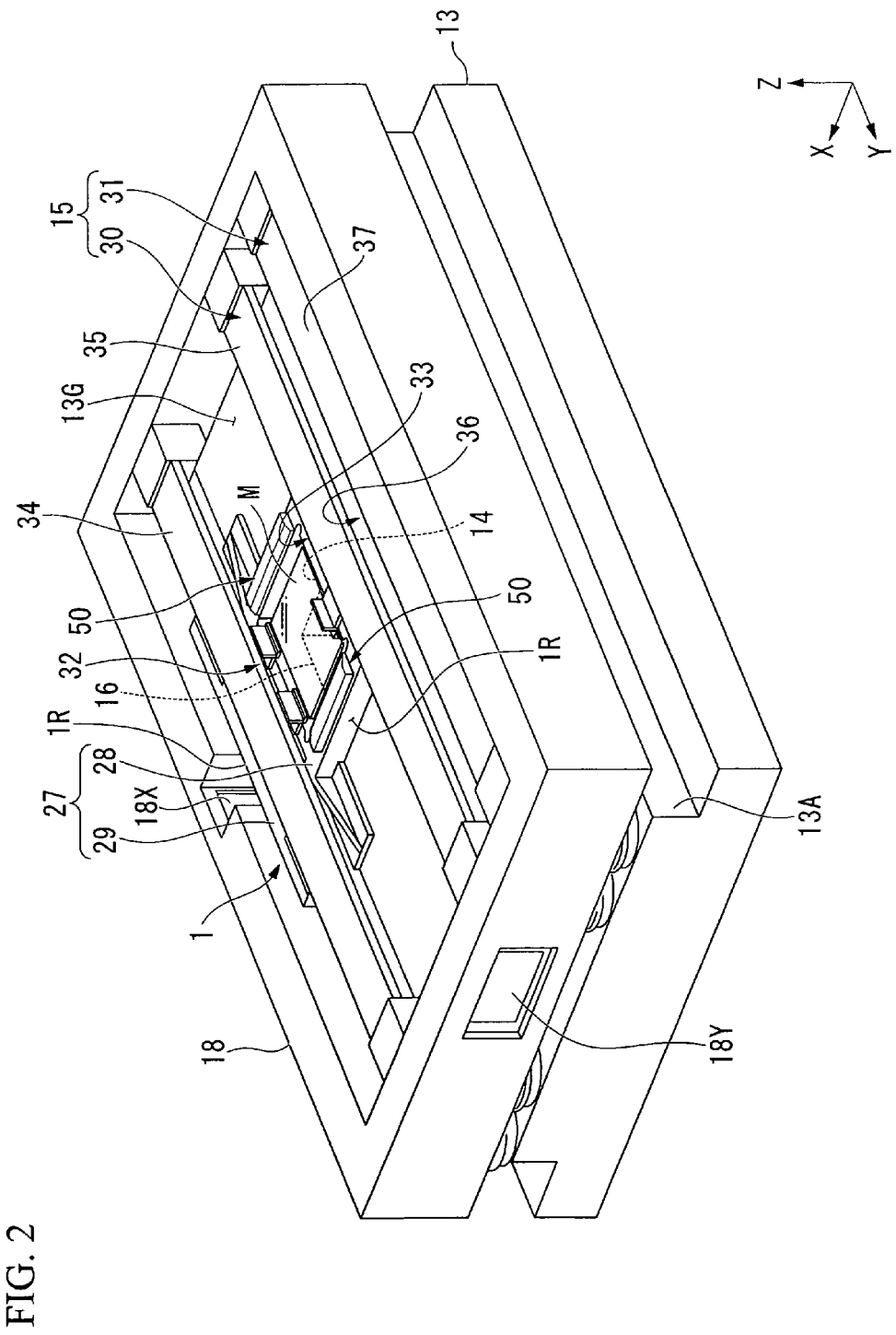
FIG. 2 is a perspective view showing adjacent components to a mask stage according to the first embodiment.
Figure 3:
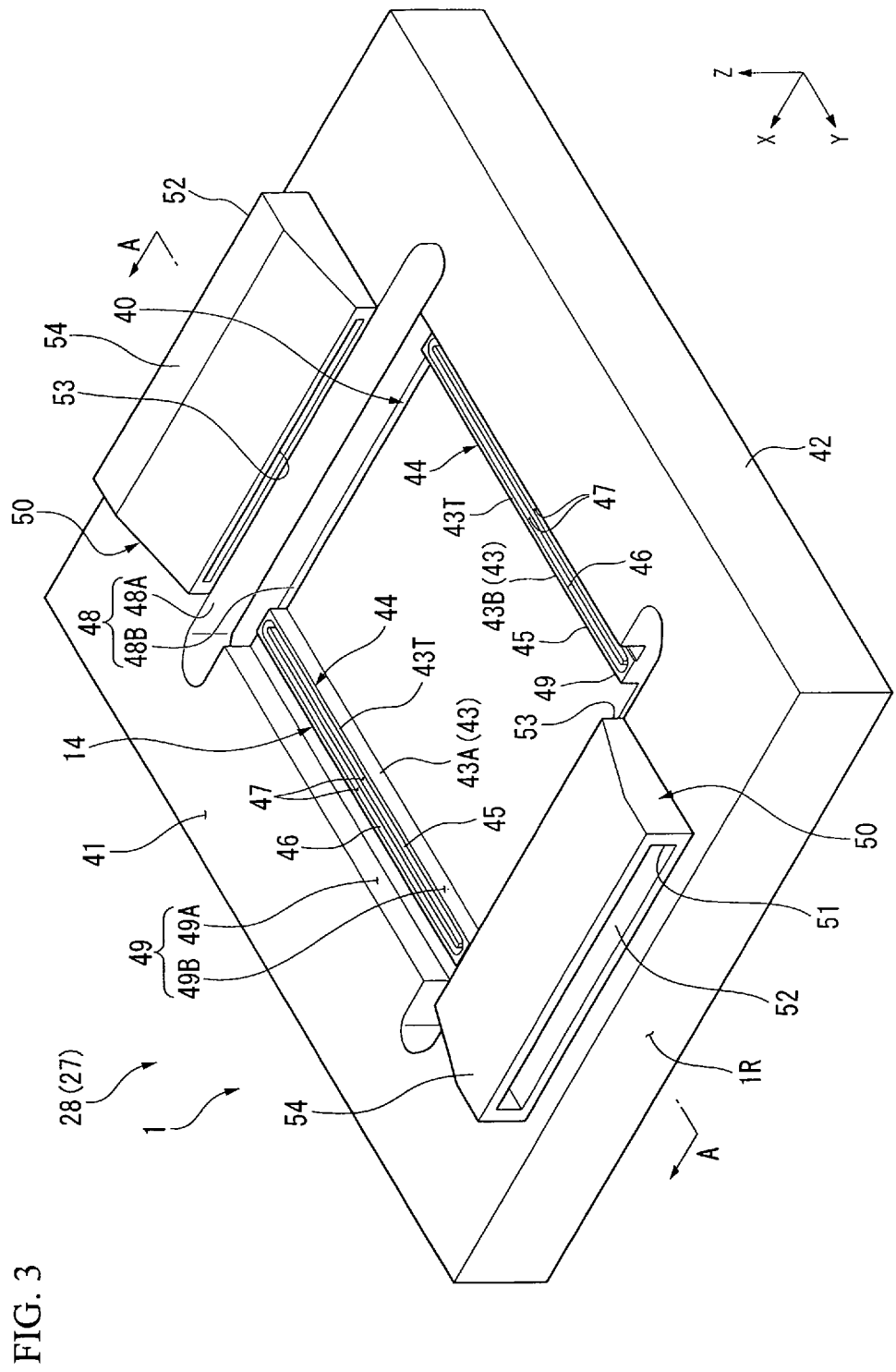
FIG. 3 is a perspective view enlarging a part of the mask stage according to the first embodiment.
Figure 4:
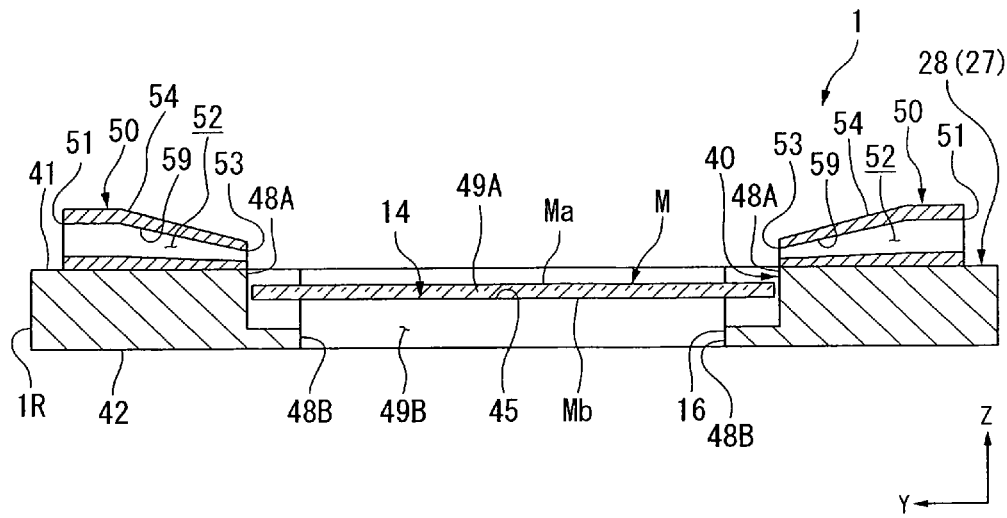
FIG. 4 is a sectional view along the line A-A in FIG. 3.

Next the mask stage 1 will be described making reference to FIG. 2, FIG. 3 and FIG. 4. FIG. 2 is a perspective view showing adjacent components to the mask stage 1, the counter mass 18 and the second plate 13 according to this embodiment. FIG. 3 is a perspective view enlarging a section of the mask stage 1. FIG. 4 is a sectional arrow view along the line A-A in FIG. 3.

In FIG. 2, FIG. 3 and FIG. 4, the mask stage 1 includes a mask stage main body 27 provided with a mask retaining section 14 and an intake structure (intake mechanism) 50 supplying gas to the surface of the mask M retained on the mask retaining section 14. Since the intake structure 50 introduces gas to the mask M, it may for example be termed a flow controller, a flow adjustment member, an air conductive member or an induction pod.

As shown in FIG. 2, the mask stage main body 27 includes a first member 28 which is substantially rectangular in an XY plane and a second member 29 elongated in the Y axis and connected to the +X end of the first member 28. The mask retaining section 14 is provided on the first member 28. The first aperture 16 is formed in a substantially central section of the first member 28. The mask retaining section 14 is disposed on at least a part of the periphery of the first aperture 16.

The first member 28 has a reflective face 1R on a +Y side face for reflecting measuring light LB from the laser interferometer 19A. The reflective face 1R of the first member 28 is substantially perpendicular to the Y axis. A light-transmission region 18Y is disposed on a +Y side face of the counter mass 18 to enable transmission of measuring light LB of the laser interferometer 19A. The laser interferometer 19A can illuminate measuring light LB onto the reflective face 1R of the first member 28 through the light-transmission region 18Y.

The second member 29 has a reflective face 1R on a +X side face which is illuminated by measuring light LB from the laser interferometer 19A. The reflective face 1R of the second member 29 is substantially perpendicular to the X axis. A light-transmission region 18X is disposed on a +X side face of the counter mass 18 to enable transmission of measuring light LB of the laser interferometer 19A. The laser interferometer 19A can illuminate measuring light LB onto the reflective face 1R of the second member 29 through the light-transmission region 18X.

In the embodiment, a protruding portion 13A is provided at a substantially central section of the second plate 13. The guide face 13G of the second plate 13 includes the upper face of the protruding portion 13A. The mask stage main body 27 is non-contact supported on the upper face 13G of the protruding portion 13A by a gas bearing. The second aperture 17 is formed in a substantially central section of the protruding portion 13A of the second plate 13.

The mask stage drive device 15 can move the mask stage 1. The mask stage drive device 15 includes a first drive device 30 that is capable of moving the mask stage 1 in the Y-axis or θZ directions and a second drive device 31 that is capable of moving the mask stage 1 in the X axis direction. In the embodiment, the first drive device 30 includes a pair of linear motors 32, 33 and the second drive device 31 includes a voice coil motor 36.

The first drive device 30 is provided with a pair of guide members 34, 35 elongated along the Y axis direction. The guide members 34, 35 respectively have coil units which function as stators for the linear motors 32, 33. The guide members 34, 35 are disposed on the inner side of the counter mass 18. The guide member 34 and the guide member 35 are separated in the X axis direction. The −Y end and +Y end of the guide members 34, 35 are fixed to the inner side face of the counter mass 18 by a predetermined fixing member.

The guide members 34, 35 support the mask stage main body 27 to move in the Y axis direction. In the embodiment, the first member 28 of the mask stage main body 27 has a magnet unit which functions as a mover for the linear motors 32, 33. The first member 28 is disposed between the guide member 34 and the guide member 35. The movers of the linear motors 32, 33 are respectively provided in the +X end and −X end of the first member 28.

In the embodiment, a moving-magnet linear motor 32 allowing movement of the mask stage main body 27 in the Y axis direction is formed from the movers provided on the +X end of the first member 28 and the stators provided on the guide member 34. In the same manner, a moving-magnet linear motor 33 allowing movement of the mask stage main body 27 in the Y axis direction is formed from the movers provided on the −X end of the first member 28 and the stators provided on the guide member 35.

The control apparatus 3 moves the mask stage 1 (mask stage main body 27) in the Y axis direction by equalizing the thrust produced respectively by the pair of linear motors 32, 33 to therefore enable control of a position in the Y axis direction. The control apparatus 3 moves the mask stage 1 (mask stage main body 27) in a θZ direction (rotational direction) by varying the thrust produced respectively by the pair of linear motors 32, 33 and therefore enables control of a position in the θZ direction.

The second drive device 31 includes a guide member 37 elongated along the Y axis direction. The guide member 37 has a coil unit which functions as a stator for the voice coil motor 36. The guide member 37 is disposed on the inner side of the counter mass 18. The guide member 37 is disposed on the −X side of the guide member 35. The −Y end and +Y end of the guide member 37 are fixed to the inner side face of the counter mass 18 by a predetermined fixing member.

A magnet unit is disposed on the −X end of the mask stage main body 27 to function as a mover for the voice coil motor 36.

In the embodiment, a moving-magnet linear motor 36 allowing movement of the mask stage main body 27 in the X axis direction is formed from the movers provided on the −X end of the mask stage main body 27 and the stators provided on the guide member 37.

The control apparatus 3 applies a current to the fixed elements in the voice coil motor 36 to produce an electromagnetic force (Lorentz force) in the X axis direction based on a magnetic field provided by the moveable magnetic units and the current flowing in the coil units. The control apparatus 3 uses the reaction force to the Lorentz force to move the mask stage 1 (mask stage main body 27) in the X axis direction to therefore enable control of a position in the X-axis direction.

In this manner, the mask stage 1 can move in the X axis, the Y axis and the θZ directions due to the mask stage drive device 15 including the first and second drive devices 30, 31. The mask stage main body 27 can move along the XY plane including the illumination position (illumination region of the illumination system IL) of the exposure light EL with the mask M retained by the mask retaining section 14.

The counter mass 18 is a rectangular frame-shaped member having an aperture for mounting the mask stage 1. The counter mass 18 can move on the upper face of the second plate 13 to cancel out the reaction force produced by the movement of the mask stage 1. The counter mass 18 cancels out the reaction force produced by the movement of the mask stage 1 by moving in a direction opposite to the direction of movement of the mask stage 1.

A shown in FIG. 3 and FIG. 4, the first member 28 has a recessed portion 40 (recess). The mask retaining section 14 is disposed on the inner side of the recessed portion 40. An upper face 41 of the first member 28 is disposed around the recessed portion 40.

The recessed portion 40 is disposed in a substantially central portion of the first member 28 in an XY plane. A first aperture 16 allowing passage of the exposure light EL is disposed on the inner side of the recessed portion 40. The first aperture 16 is disposed in a substantially central portion of the recessed portion 40 in an XY plane. The mask retaining section 14 is disposed on at least a part of the periphery of the first aperture 16.

The mask retaining section 14 has a pedestal 43 (43A, 43B) disposed on at least a section of the periphery of the first aperture 16 and a suction pad 44 provided on the pedestal 43. The suction pad 44 is provided on an upper face 43T of the pedestal 43. In the embodiment, two pedestals 43 and suction pads 44 are disposed on a section of the periphery of the first aperture 16. In the embodiment, the pedestal 43 includes a first pedestal 43A disposed on the +X side and a second pedestal 43B disposed on the −X side relative to the first aperture 16. In the embodiment, the upper face 43T of the pedestal 43 is elongated along the Y axis direction. The suction pad 44 has a retaining face 45 for retaining at least a part of the lower face Mb of the mask M. The retaining face 45 includes at least a part of the upper face 43T of the pedestal 43. In the embodiment, the retaining face 45 is substantially parallel to the XY plane. The suction pad 44 has a groove 46 formed in a section of the upper face 43T of the pedestal 43 and a suction port 47 formed on an inner side of the groove 46. The retaining face 45 includes a section in which grooves 46 are not formed in the upper face 43T of the pedestal 43. The suction port 47 is connected by a passage (not shown) to an evacuation device including a vacuum system.

The suction pad 44 is retained so that at least a part of the lower face Mb of the mask M is attached. The retaining face 45 of the suction pad 44 and a part of the lower face Mb of the mask M are placed in contact and gas in the space defined by the inner side face of the groove 46 and the lower face Mb of the mask M is evacuated through the suction port 47 by the operation of the evacuation device connected to the suction port 47. As a result, the space is placed in a state of negative pressure. In this manner, the lower face Mb of the mask M is retained by suction on the retaining face 45. The mask stage 1 can move with the mask M retained on the retaing face 45. The mask M can be removed from the mask retaining section 14 by stopping the evacuation operation using the suction port 47.

A section of the lower face Mb of the mask M has a pattern formation region on which a pattern is formed. The suction pad 44 including the retaining face 45 retains regions of the lower face Mb of the mask M other than the pattern formation region. The mask retaining section 14 retains the mask M so that the pattern formation region of the mask M is disposed in the first aperture 16.

The mask retaining section 14 retains the mask M so that the lower face Mb of the mask M is substantially parallel to the XY plane. Furthermore the upper face Ma of the mask M retained on the mask retaining section 14 is substantially parallel to the XY plane.

The recessed portion 40 has an inner side face 48 disposed on both sides of the first aperture 16 in the Y axis direction, and the inner side face 49 disposed on both sides of the aperture 16 in the X-axis direction. The inner side faces 48, 49 are disposed on the mask retaining section 14 and around the mask M retained on the mask retaining section 14. In the embodiment, the inner side face 48 is substantially perpendicular to the Y axis and the inner side face 49 is substantially perpendicular to the X axis. In the embodiment, the inner side face 48 has a step and includes a first inner side face 48A on the +Z side and a second inner side face 48B on the −Z side.

The inner side face 49 includes a third inner side face 49A on the +Z side and a fourth inner side face 49B on the −Z side. At least apart of the first and third inner side faces 48A, 49A is disposed on the +Z side of the upper face Ma of the mask M retained on the mask retaining section 14. The second and fourth inner side faces 48B, 49B are disposed on the −Z side of the lower face Mb of the mask M retained on the mask retaining section 14.

The mask retaining section 14 is disposed on an inner side of the recessed portion 40 and the retaining face 45 is disposed on the −Z side of the upper face 41. In the embodiment, the mask M retained on the mask retaining section 14 is disposed on an inner side of the recessed portion 40. In other words, the upper face Ma and lower face Mb of the mask M retained on the mask retaining section 14 are respectively disposed on the inner sides of the recessed portion 40. That is to say, the upper face Ma of the mask M retained on the mask retaining section 14 is disposed on the −Z side of the upper face 41 of the first member 28. The lower face Mb of the mask M retained on the mask retaining section 14 is disposed on the +Z side of the lower face 42 of the first member 28.

The upper face 41 of the first member 28 is disposed around the mask retaining section 14 and the upper face Ma of the mask M retained on the mask retaining section 14. In the embodiment, the upper face 41 is substantially parallel to the XY plane and substantially parallel to the upper face Ma of the mask M retained on the mask retaining section 14. The lower face 42 of the first member 28 is disposed around the mask retaining section 14 and the lower face Mb of the mask M retained on the mask retaining section 14. In the embodiment, the lower face 42 is substantially parallel to the XY plane and substantially parallel to the lower face Mb of the mask M retained on the mask retaining section 14.

Therefore, in the embodiment, with reference to the Z axis direction, the upper face Ma of the mask M retained on the mask retaining section 14 is closer to the center of the first member 28 than the upper face 41 of the first member 28. Furthermore with reference to the Z axis, the lower face Mb of the mask M retained on the mask retaining section 14 is closer to the center of the first member 28 than the lower face 42 of the first member 28.

In the embodiment, a recessed portion 40 is formed in the first member 28 and the mask M is disposed on an inner side of that recessed portion 40. For example with reference to the Z axis direction, the position of the center of gravity of the first member 28 can be placed in proximity to the position of the lower face (pattern forming face) Mb of the mask M. In other words, a preferred arrangement of the object properties (weight balance) of the mask stage main body 27 on the Z axis can be maintained even when the mask M is retained on the mask retaining section 14. In this manner, the slope (inclination in a θX direction) of the mask stage 1 is suppressed, for example, even when the mask stage 1 moves in the Y axis direction with the mask M retained on the mask retaining section 14. Furthermore bending deformation of the mask stage 1 can be suppressed. In addition, the placement of the mask M on the inner side of the recessed portion 40 enables a desired positional relationship between the lower face Mb of the mask M and the plane of incidence (object plane of the projection optical system PL) of the projection optical system PL. In this manner, the formation of the recessed portion 40 in the first member 28 and the disposition of the mask M on the inner side of the recessed portion 40 suppress a reduction in the performance of the exposure apparatus EX including the movement performance of the mask stage 1.

The intake structure (flow control section 50) includes an intake port 51 taking in gases, a first gas passage 52 enabling flow of gases from the intake port 51 and a supply port (discharge port) 53 supplying gases flowing from the first gas passage 52 to the upper surface Ma of the mask M retained on the retaining section 14.

In the embodiment the intake structure 50 is disposed in the first member 28. The intake structure 50 disposed in the first member 28 can move synchronously with the first member 28.

In the embodiment, the intake structure 50 is disposed at a position opposite the upper face 41 of the first member 28. In the embodiment the intake structure 50 is disposed in a predetermined region of the upper face 41.

The supply port 53 is disposed on at least a part of the periphery of the mask retaining section 14 and the mask M retained on the mask retaining section 14. In the embodiment, two supply ports 53 are disposed in the periphery of the mask retaining section 14 and the mask M retained on the mask retaining section 14. In the embodiment supply ports 53 are respectively disposed on both sides of the mask M retained on the mask retaining section 14 in the Y-axis direction.

Furthermore with reference to the Z-axis direction, the supply ports 53 are disposed in positions which differ from the upper face Ma of the mask M. In the embodiment, a supply port 53 is disposed on the +Z side relative to the upper face Ma of the mask M. In the embodiment, a supply port 53 is disposed at a position separated far from the upper face Ma of the mask M than the upper face 41 of the first member 28. In other words, the supply port 53 is disposed further on the +Z side than the upper face 41.

In the embodiment, the supply port 53 is disposed lateral to the upper face Ma of the mask M in an XY plane. In the embodiment, the supply port 53 supplies gas from an oblique direction to the upper face Ma of the mask M retained on the mask retaining section 14.

The intake port 51 is disposed at an outer side of the supply port 53 with respect to the mask retaining section 14 and a mask M retained on the mask retaining section 14. Intake ports 51 are respectively disposed on both sides in the Y axis direction, of the mask M retained on the mask retaining section 14.

In other words, in the embodiment, the intake structure 50 including the intake port 51, the first gas passage 52 and the supply port 53 is disposed at each outer side in the Y axis direction, of the mask M retained on the mask retaining section 14.

In the embodiment, the intake port 51 is disposed at a position facing the upper face 41 of the first member 28 and on the +Z side of the upper face 41. In other words, the intake port 51 is located medial to the outer edge of the upper face 41 in an XY plane. That is to say, in the XY plane, the intake port 51 is closer to the center of the first member 28 than the reflective face 1R. To measure the positional information of the mask stage main body 27, the laser interferometer 19A directs measuring light LB onto the reflective face 1R disposed outwardly lateral to the intake structure 50 with respect to the mask retaining section 14 (center of the first member 28).

In the embodiment, the intake structure 50 includes a nozzle member 54 on or in which are formed the intake port 51, the first gas passage 52 and the supply port 53. The nozzle member 54 is fixed at a predetermined position on the upper face 41 of the first member 28. Nozzle members 54 are disposed respectively at both outer sides in the Y axis direction, of the mask M retained on the mask retaining section 14. The positional relationship relative to the mask M and the structure of the nozzle member 54 disposed on the +Y side of the mask M are substantially identical to the positional relationship relative to the mask M and the structure of the nozzle member 54 disposed on the −Y side.

In the embodiment, the intake port 51 is larger than the supply port 53. The first gas passage 52 gradually narrows from the intake port 51 towards the supply port 53. In the embodiment, the supply port 53 has a slit shape elongated along the X axis. The width (size in the X axis direction) of the supply port 53 is substantially equal to the width (size in the X axis direction) of the mask M. Alternatively, the width of the supply port 53 may be larger than the width of the mask M.

In the embodiment, the intake structure 50 has a control face 59 by which at least the direction of gas flow is controlled. At least a portion of the control face 59 has an inclination with respect to the movement plane of the mask stage 1. In the inclination of the control face 59, the closer to the mask M along the movement plane of the mask stage 1, the closer to the mask M along a direction intersecting with the movement plane.

Next an example of the operation of the exposure apparatus EX according to this embodiment will be described. The mask M is conveyed and retained by the mask retaining section 14. The substrate P is conveyed and retained by the substrate retaining section 22. The chamber apparatus 5 regulates the environment (the temperature, humidity and cleanliness level) of the inner space 4 and the control apparatus 3 initiates exposure of light onto the substrate P.

The control apparatus 3 operates the mask stage drive device 15 and the substrate stage drive device 25 and moves the substrate P on the Y axis direction relative to the projection optical system PL and the projection region PR. The mask M is moved on the Y axis direction relative to the illumination region IR of the illumination system IL synchronously with the movement of the substrate P on the Y axis direction, and the mask M is illuminated by exposure light EL by the illumination system IL to expose the substrate P with the exposure light EL transmitting through the mask M and the projection optical system PL. In this manner, an image pattern of the mask M is projected onto the substrate P through the projection optical system PL.

Figure 5:
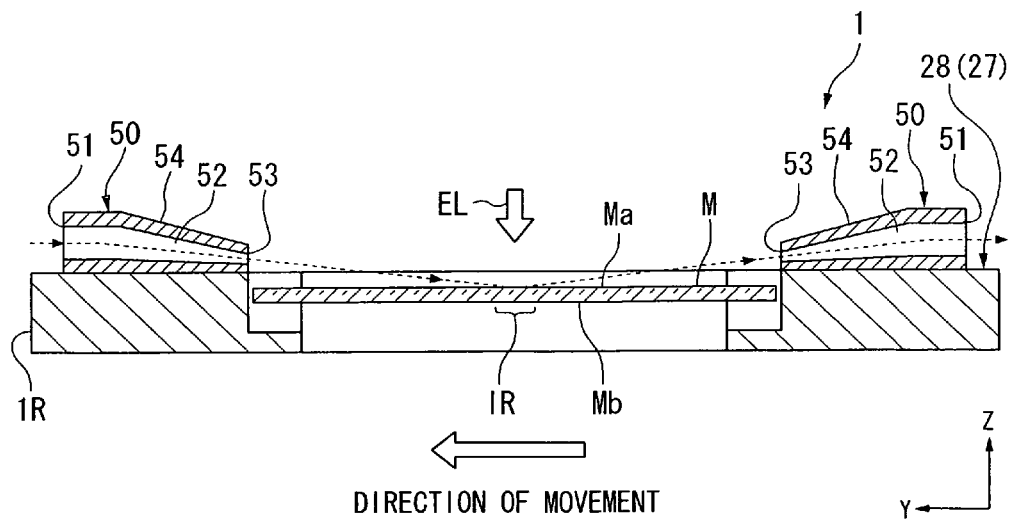
FIG. 5 shows an example of the operation of the mask stage according to the first embodiment.

FIG. 5 is a figure showing the mask stage 1 moving on the +Y direction. As the mask stage 1 moves in a +Y direction, gas from the inner space 4 of the chamber apparatus 5 flows into the intake port 51 disposed forward of the mask M moving in the Y-axis direction. Specifically, gas in the inner space 4 flows into the intake port 51 of the nozzle member 54 disposed on the +Y side relative to the mask M. The intake port 51 takes in gas from the inner space 4. The gas taken in via the intake port 51 flows through the first gas passage 52 of the nozzle member 54 and is supplied to the supply port 53. The supply port 53 supplies gas flowing from the first gas passage 52 to the upper face Ma of the mask M retained on the mask retaining section 14. The supply port 53 supplies gas in an oblique direction to the upper face Ma of the mask M from a position above the upper face Ma of the mask M and outside the upper face Ma of the mask M in an XY plane.

The temperature increase in the mask M caused by the illumination of the exposure light EL for example is suppressed by the gas supplied to the upper face Ma of the mask M from the supply port 53. In the embodiment, the exposure light EL of the illumination system IL is incident upon the upper face Ma of the mask M and the supply port 53 supplies gas in an oblique direction to the upper face Ma of the mask M. For example, the supply port 53 supplies gas to the illumination position (illumination region IR) for the exposure light EL and the adjacent part thereto on the upper face Ma of the mask M. The supply port 53 is disposed on the +Z side of the upper face Ma of the mask M and gas is supplied smoothly toward the illumination position of exposure light EL on the upper face Ma of the mask M.

In the embodiment, since the nozzle member 54 including the supply port 53 is disposed outwardly lateral to the upper face Ma of the mask M in an XY plane, there is no impediment to illumination of exposure light EL onto the mask M.

In the embodiment the intake port 51 is larger than the supply port 53 and can efficiently take in gas from the inner space 4. Since the first gas passage 52 gradually narrows from the intake port 51 towards the supply port 53, the flow velocity of gas supplied to the mask M from the supply port 53 is increased. In the embodiment, the supply port 53 supplies gas at a flow velocity, which is at least higher than the movement velocity of the mask stage 1, to the mask M. Thus temperature increase in mask M can be effectively suppressed.

In the embodiment, since the supply port 53 is formed in a slit shape which has a width which is substantially equal to the width of the mask M or which has a width which is larger than the mask M, gas is effectively supplied to a wide region of the upper face Ma of the mask M. In the XY plane, when the illumination region IR of the illumination system IL is formed as an elongated slit (rectangular shape) in the X axis direction, the temperature increase of the mask M can also be effectively suppressed by making the width of supply port 53 substantially equal to the width (the size in the X axis direction) of the illumination region IR.

In the embodiment, in the XY plane, the intake structure 50 is disposed at an inner side of the outer edge of the upper face 41, that is to say, closer to the center of the first member 28 than the reflective face 1R. In this manner, an effect of the intake structure 50 on the operation of the laser interferometer 19A can be suppressed. For example, when a gas flow produced by the intake structure 50 flows into the path of measuring light LB from the laser interferometer 19A, the measurement accuracy of the laser interferometer 19A may be adversely affected. In the embodiment, effects of the intake structure 50 on the operation of the laser interferometer 19A can be suppressed and a reduction in the measurement accuracy of the laser interferometer 19A can be suppressed.

At least a portion of the gas supplied via the supply port 53 to the upper face Ma of the mask M and flowing over the upper face Ma of the mask M flows into the supply port 53 of the nozzle member 54 disposed rearward of the mask M moving in the Y axis direction. Specifically, at least a portion of gas passing over the upper face Ma of the mask M flows into the supply port 53 of the nozzle member 54 disposed on the −Y side relative to the mask M.

In the embodiment, the intake structure 50 including the nozzle member 54 disposed rearward of the mask M moving in the Y axis direction directions as an outlet structure (outlet mechanism, flow control section) which includes an inflow port (53) into which flows at least a portion of the gas flowing over the upper face Ma of the mask M, a second gas passage (52) into which flows gas from the inflow port (53) and an outlet port (51) from which is discharged gas flowing from the second gas passage (52). In the description below, the supply port 53 of the nozzle member 54 disposed rearward of the mask M moving in the Y axis direction is termed, as suitable, the inflow port 53, the first gas passage 52 of the nozzle member 54 is termed the second gas passage 52, and the intake port 51 of the nozzle member 54 is termed the outlet port 51.

The positional relationship relative to the mask M and structure of the nozzle member 54 functioning as an intake structure disposed at the +Y side of the mask M is the same as the positional relationship relative to the mask M and the structure of the nozzle member 54 functioning as an outlet structure disposed at the −Y side.

The inflow port 53 is disposed in an oblique orientation with respect to the upper face Ma of the mask M. At least a part of the gas passing over the upper face Ma of the mask M flows into the inflow port 53. The inflow port 53 is formed in a slit shape which has a width which is substantially equal to the width of the mask M or larger than the mask M, and gas passing over the upper face Ma of the mask M can smoothly flow into the inflow port 53.

Gas flowing into the inflow port 53 flows through a second gas passage 52 of the nozzle member 54 and is supplied to the outlet port 51. The outlet port 53 discharges gas flowing from the second gas passage 52 in a different direction to the direction of the path of measuring light LB. In this manner, adverse effects of the outlet structure on the operation of the laser interferometer 19A can be suppressed. For example, when gas discharged from the outlet port 51 of the outlet structure flows into the path of the measuring light LB of the interferometer 19A, there is a possibility of a reduction in the measurement accuracy of the laser interferometer 19A. According to this embodiment adverse effects of the outlet structure on the operation of the laser interferometer 19A can be suppressed and a reduction in the measurement accuracy of the laser interferometer 19A can be suppressed.

In the embodiment since the outlet port 51 is larger than the inflow port 53 and the second gas passage 52 gradually widens from the inflow port 53 towards the outlet port 51, the flow velocity of gas discharged from the outlet port 51 can be reduced. Therefore effects of gas discharged from the outlet port 51 on the path of measuring light LB of the laser interferometer 19A for example can be suppressed.

An example was described above of a mask stage 1 moving in the +Y direction. When the mask stage 1 moves in the −Y direction, the nozzle member 54 disposed at the −Y side relative to the mask M functions as an intake structure and the nozzle member 54 disposed at the +Y side functions as an outlet structure. The outlet port 53 of the nozzle member 54 functioning as an outlet structure disposed at the +Y side of the mask M discharges gas in a different direction to the path of measuring light LB. The operation of the outlet structure and the intake structure when mask stage 1 moves in an −Y don is the same as the operation of the outlet structure and the intake structure when mask stage 1 moves in a +Y direction and therefore additional description will be omitted.

As described above, according to this embodiment, the intake structure 50 enables suppression of temperature change (temperature increase) in the mask M resulting from illumination with exposure light EL. Therefore occurrence of exposure defects resulting from temperature change in the mask M can be suppressed.

According to this embodiment, the mask retaining section 14 and the mask M retained on the mask retaining section 14 are disposed on the inner side of the recessed portion 40 of the first member 28. In this manner, as described above, it is possible to suppress a reduction in the performance of the exposure apparatus EX including performance of moving the mask stage 1.

According to this embodiment, temperature increase in the mask M disposed on an inner side of the recessed portion 40 is sufficiently suppressed by the intake structure 50. When an intake structure according to this embodiment is not provided, the mask M disposed at the inner side of the recessed portion 40 may tend to undergo temperature increase. For example, when the mask stage 1 moves only in the Y axis direction, the mask M may tend to undergo temperature increase due to the difficulty of producing a gas flow onto the inner side of the recessed portion 40 on which the mask M is disposed. According to this embodiment, even when the mask M is disposed in the recessed portion 40, the provision of the intake structure 50 allows gas flowing into the intake port 51 to be supplied to the mask M from the supply port 53 by merely moving the mask stage 1. Consequently gas flow is produced on the inner side of the recessed portion 40. As a result, temperature increase can be suppressed in the mask M disposed in the recessed portion 40.

In the embodiment, the intake structure and the outlet structure controls gas flow (relative flow) with respect to the mask at adjacent the mask M. For example, replacement of gas in proximity to the mask M (inner section of the recessed portion 40) is promoted. The intake structure forward of the moving mask M promotes relative gas flow at least towards the proximity of the mask M. The outlet structure rearward of the moving mask M promotes relative gas flow at least separated from the proximity of the mask M.

Since the intake structure and the outlet structure can produce preferred gas flow in proximity to the mask M disposed in the recessed portion 40, gas flow into the path of the measuring light LB of the laser interferometer 19A can be suppressed. Thus while suppressing reduction in the measurement accuracy of the laser interferometer 19A, it is possible to suppress temperature increase in the mask M.

In the embodiment, the gas supplied to the mask M via the supply port 53 has a flow velocity according to the movement velocity of the mask stage 1. In other words, when the movement velocity of the mask stage 1 increases, the flow velocity of gas supplied to the mask M via the supply port 53 also increases. For example, when the movement velocity of the mask stage 1 is increased in order to improve throughput, it is possible to increase the intensity of illumination of exposure light EL incident onto the mask M to realize the desired illumination amount onto the substrate P. In this case, the temperature of the mask M tends to increase. According to this embodiment, when the movement velocity of the mask stage 1 is increased, the flow velocity of the gas supplied by the supply port 53 to the mask M is also increased, and therefore the cooling effect on the mask M can be increased.

In the embodiment, the intake structure and the outlet structure by themselves form a passage for gas flow along the direction of movement of at least the mask stage 1. In another embodiment, the intake structure and/or the inlet mechanism form the passage for gas flow along the direction of movement of at least the mask stage 1 in cooperation with other members.

According to this embodiment, the position of at least part of the passage in a direction which intersects with the movement plane of the mask stage 1 differs from the corresponding position of the mask M. Furthermore at least part of the passage has an orientation of approaching the mask M along a direction intersecting with the movement plane as the mask M is approached along the movement plane of the mask stage 1.

In the embodiment, the flow control section such as the intake structure and the outlet structure has a tube shape. Also in the embodiment and in the other embodiments described hereafter, the flow control section is not limited to a tube shape and may adopt various shapes. For example, the flow control section may be in at least one of the shape of a hole, a plate or a vane.

Second Embodiment

A second embodiment will be described hereafter. In the description below, the constituent sections which are the same or equivalent to those described in the embodiment above are denoted by the same reference numerals and description thereof will be simplified or omitted. In the same manner as the first embodiment above, the intake structure described in each embodiment hereafter functions as an outlet structure in response to the direction of movement of the mask stage 1. The description hereafter will focus on the intake structure and description of the outlet structure will be simplified or omitted.

Figure 6:
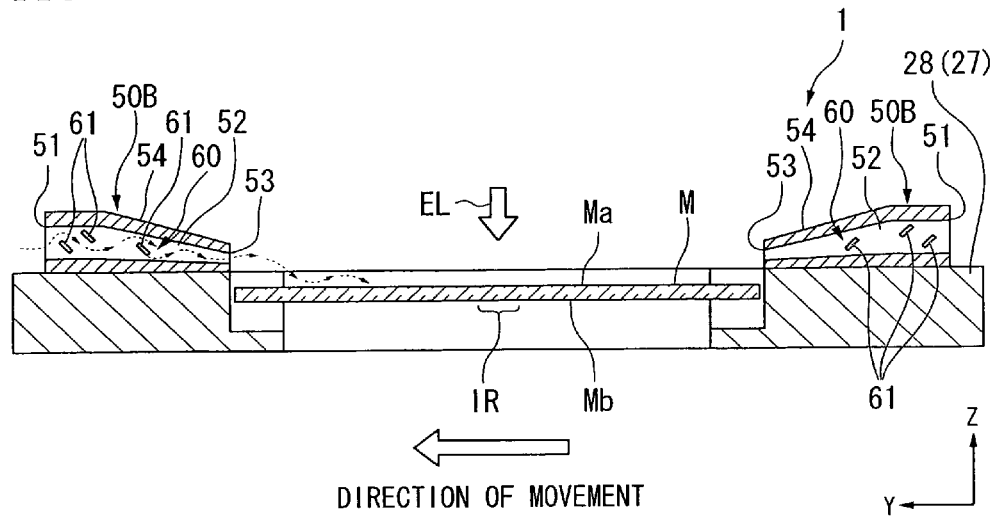
FIG. 6 shows an example of the operation of the mask stage according to a second embodiment.

FIG. 6 shows an example of a mask stage 1 having an intake structure 50B according to the second embodiment. The intake structure 50B according to the second embodiment includes a turbulence producing mechanism 60 creating turbulence in the gas supplied from the supply port 53. In the embodiment, the turbulence producing mechanism 60 includes a plurality of minute members 61 disposed on at least a section between the intake port 51 and the supply port 53. In the embodiment, the minute members 61 are minute plate members disposed in the first gas passage 52.

The minute members 61 disposed in the first gas passage 52 produce vortexes in the gas flowing through the first gas passage 52 and cause turbulent flow in the gas supplied to the mask M from the supply port 53. Thus further suppression of temperature increase in the mask M is enabled. This effect is due to the increase in the heat transfer rate resulting from an increase in the Reynolds number of the gas supplied to the mask M.

Figure 7:
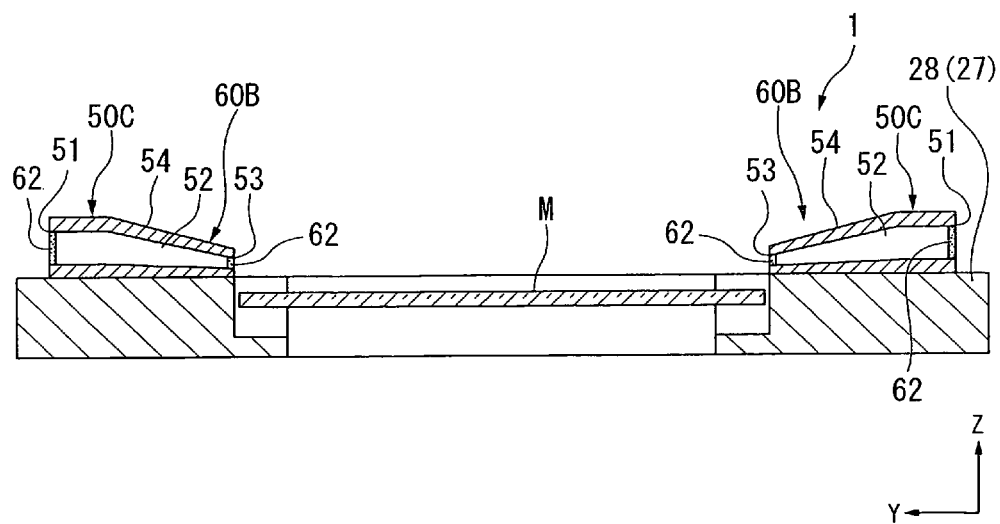
FIG. 7 shows an example of the mask stage according to the second embodiment.

As shown by the intake structure 50C in FIG. 7, the turbulence producing mechanism 60B can include a porous member 62 (mesh member) disposed in at least a section between the intake port 51 and the supply port 53. In the example shown in FIG. 7, the porous member 62 can be disposed respectively in the intake port 51 and the supply port 53. Furthermore the porous member 62 can be disposed between the intake port 51 and the supply port 53 in the first gas passage 52. Furthermore the porous member 62 may be disposed in a single predetermined position between the intake port 51 and the supply port 53 or at a plurality of positions. The gas moves in turbulent flow as a result of passing through the porous member 62. Thus turbulent flow can be produced in the gas supplied to the mask M via the supply port 53 by disposing the porous member 62 in at least a section between the intake port 51 and the supply port 53. The turbulent flow production mechanism 60B can be termed for example a Vortex Generator.

Third Embodiment

A third embodiment will be described hereafter. In the description below, the constituent sections which are the same or equivalent to those described in the embodiments above are denoted by the same reference numerals and description thereof will be simplified or omitted.

Figure 8:
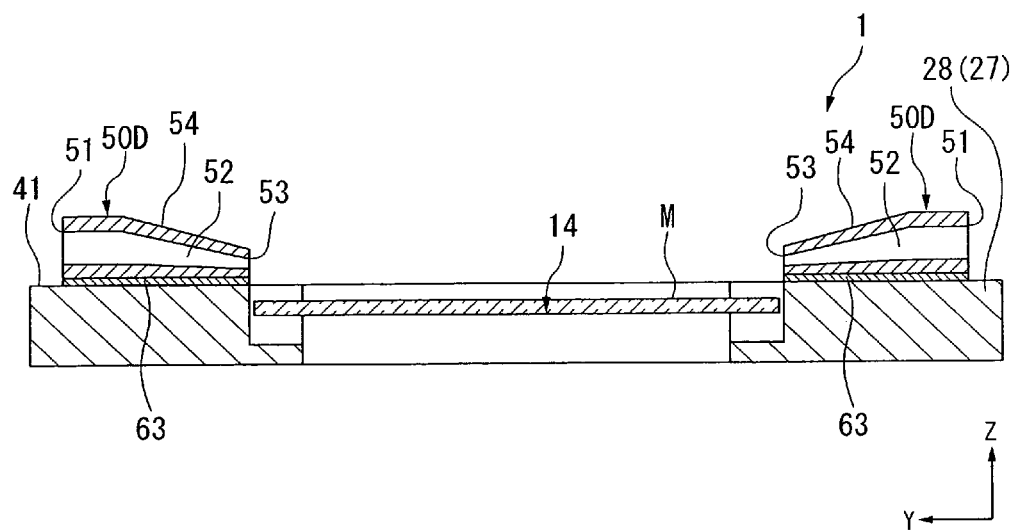
FIG. 8 shows an example of the mask stage according to a third embodiment.

FIG. 8 shows an example of a mask stage 1 according to a third embodiment. The third embodiment may be characterized in the provision of a drive device 63 enabling movement of the nozzle member 54 for adjustment of the positional relationship of the first member 28 and the nozzle member 54.

In FIG. 8, the intake structure 50D is provided with a drive device 63 enabling movement of the nozzle member 54. In the embodiment the drive device 63 is disposed between the upper face 41 of the first member 28 and the nozzle member 54. The drive device 63 includes an actuator driven by a Lorentz force such as a voice coil motor. The drive device 63 can move the nozzle member 54 with respect to the first member 28 in the six directions given by the X axis, the Y axis, Z axis, and θX, θY and θZ directions. The drive device 63 can adjust the positional relationship of the supply port (inflow port) 53 and the mask M retained on the mask retaining section 14 by moving the nozzle member 54. The adjustable positional relationship of the mask M and the supply port 53 enables supply of gas from the supply port 53 to a desired position on the mask M. Furthermore the adjustable positional relationship of the mask M and the inflow port 53 facilitates the flow of gas over the upper face Ma of the mask M into the inflow port 53.

The drive device 63 can adjust the position of the intake port (outlet port) 51. The adjustable position of the in the port 51 enables improvement in the efficiency of gas intake from the inner space 4. The adjustable position of the outlet port 51 enables discharge of gas in a desired direction. In the embodiment, the nozzle member 54 can move with six degrees of freedom; however, the direction of movement may be less or equal to five directions, for example only with respect to the Y axis direction or in the Y-axis and Z-axis directions. The drive device 63 is not limited to the above arrangement and may take another arbitrary arrangement.

Fourth Embodiment

A fourth embodiment will be described hereafter. In the description below, the constituent sections which are the same or equivalent to those described in the embodiment above are denoted by the same reference numerals and description thereof will be simplified or omitted.

Figure 9:
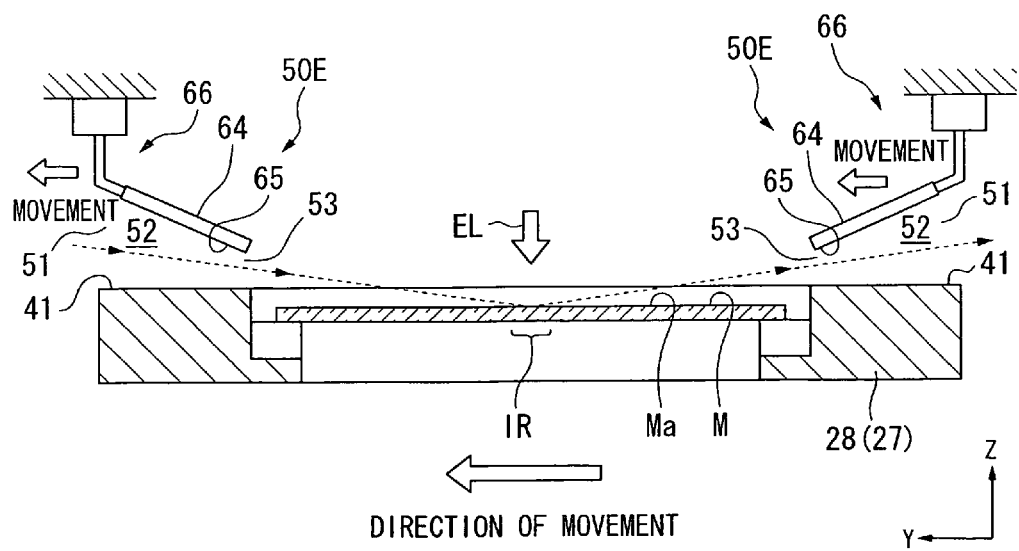
FIG. 9 shows an example of the mask stage according to a fourth embodiment.

FIG. 9 shows an example of au intake structure 50E according to a fourth embodiment. In FIG. 9, the intake structure 50E is provided with a passage formation member 64 enabling formation of at least a section of the intake port 51, the first gas passage 52 and the supply port 53 with the upper face 41 of the first member 28.

The passage formation member 64 is a plate member having a lower face (control face) 65 that an oppose with the upper face 41 of the first member 28. The passage formation member 64 forms the intake port 51, the first gas passage 52 and the supply port 53 between the lower face 65 and the upper face 41. As shown in FIG. 9, the lower face 65 of the passage formation member 64 is inclined with respect to the upper face 41 and the first gas passage 52 gradually narrows from the intake port 51 towards the supply port 53.

A support device 66 supports the passage formation member 64 to enable movement thereof. The support device 66 includes an actuator and can move the passage formation member 64 in order to adjust the positional relationship of the first member 28 (mask stage 1) and the passage formation member 64.

The support device 66 can move the passage formation member 64 synchronously with the movement of the first member 28 (mask stage 1). The support device 66 moves the passage formation member 64 synchronously with the movement of the mask stage 1 to maintain (fix) the positional relationship of the moving mask stage 1 and the passage formation member 64. Also in the embodiment, temperature increase of the mask M is suppressed.

Fifth Embodiment

A fifth embodiment will be described hereafter. In the description below, the constituent sections which are the same or equivalent to those described in the embodiment above are denoted by the same reference numerals and description thereof will be simplified or omitted.

Figure 10:
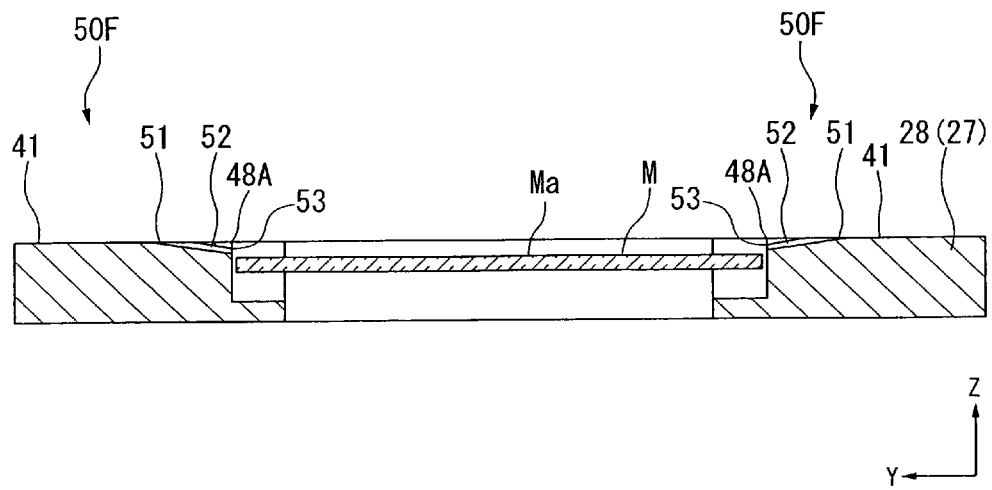
FIG. 10 shows an example of the mask stage according to a fifth embodiment.

FIG. 10 shows an example of an intake structure 50F according to a fifth embodiment. In the embodiment, as shown in FIG. 10, at least a section of the intake structure 50F is formed on the first member 28. In the embodiment, the intake port 51 is formed in the upper face 41 of the first member 28, the supply port 53 is formed in a first inner face 48A and the first gas passage 52 is formed in an inner section in the first member 28. The supply port 53 supplies gas onto the upper face Ma of the mask M retained on the mask retaining section 14. Also in the embodiment, the intake structure 50F suppresses temperature increase of the mask M.

Sixth Embodiment

A sixth embodiment will be described hereafter. In the description below, the constituent sections which are the same or equivalent to those described in the embodiment above are denoted by the same reference numerals and description thereof will be simplified or omitted.

Figure 11:
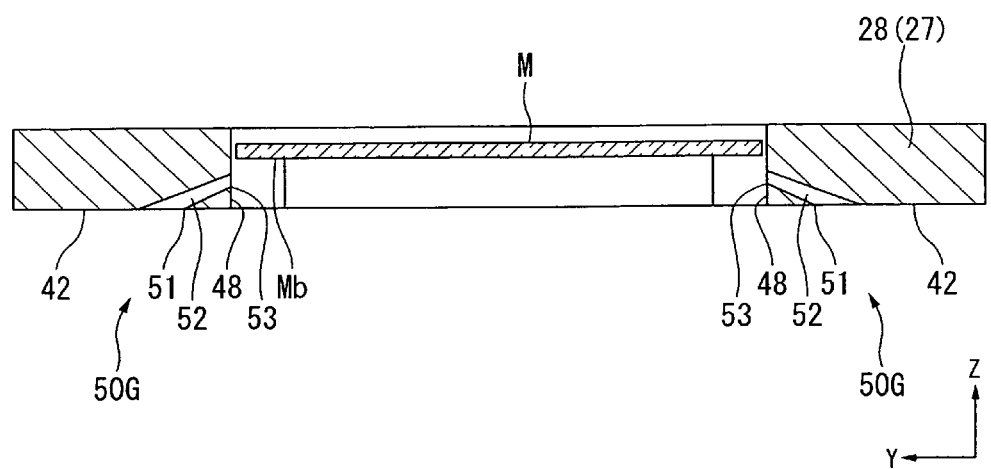
FIG. 11 shows an example of the mask stage according to a sixth embodiment.

FIG. 11 shows an example of an intake structure 50G according to a sixth embodiment. In the embodiments described above, an example was described in which the supply port 53 of the intake structure supplies gas towards the upper face Ma of the mask M. This embodiment is characterized in the supply of gas towards the lower face (pattern forming face) Mb of the mask M.

As shown in FIG. 11, in this embodiment, at least apart of the intake structure 50G is formed on the first member 28. In the embodiment, the intake port 51 is formed in the lower face 42 of the first member 28, the supply port 53 is formed in an inner side face 48 (48B) and the first gas passage 52 is formed in an inner section in the first member 28. The supply port 53 supplies gas onto the lower face Mb of the mask M retained on the mask retaining section 14. Also in the embodiment, the intake structure 50G suppresses temperature increase of the mask M.

A nozzle member 54 as described with reference to the first embodiment above may be disposed on the lower face 42 of the first member 28 and gas may be supplied from the supply port 53 of the nozzle member 54 towards the lower face Mb of the mask M.

A passage formation member 64 as described with reference to the fourth embodiment above may be disposed at a position facing the lower face 42 of the first member 28. A supply port 53 supplying gas towards the lower face Mb of the mask M and a first gas passage 52 and intake port 51 connected to the supply port 53 may be formed between the passage formation member 64 and the lower face 42 of the first member 28.

In each of the above embodiments, although an example was described in which the supply port 53 is disposed on the +Y side and the −Y side with respect to the mask M, the supply port 53 may be disposed on the +X side and the −X side with respect to the mask M. For example, the intake port 51 can be disposed forward of the mask M moving with reference to the Y axis, the supply port 53 can be disposed on the +X side (or −X side) of the mask M and a first gas passage 52 formed to connect the intake port 51 and the supply port 53. In this manner, the movement of the mask stage 1 on the Y axis can supply gas taken in by the intake port 51 through the first gas passage 52 and the supply port 53 to the mask M.

For example, a nozzle member, which has a shape in which the intake port 51 can be disposed forward of the mask M moving with reference to the Y axis direction and the supply port 53 is disposed on the +X side (or the −X side) of the mask M, is disposed at the first member 28. As the mask stage 1 moves in the Y axis direction, gas taken in from the intake port 51 can be supplied through the first gas passage 52 and the supply port 53 to the mask M. Furthermore the intake port 51 may be formed for example on the upper face 41 of the first member 28, the supply port 53 formed on a third inner side face 49A and a first gas passage 52 formed on an inner section of the first member 28 to connect the intake port 51 and the supply port 53. Thus gas can be supplied to the upper face Ma of the mask M. Furthermore the intake port 51 may be formed on the lower face 42 of the first member 28, the supply port 53 formed on a fourth inner side face 49B and a first gas passage 52 formed on an inner section of the first member 28 to connect the intake port 51 and the supply port 53. Thus gas can be supplied to the lower face Mb of the mask M.

In this manner, the supply port 53 can be disposed on at least a part of the periphery of the mask retaining section 14 and the mask M retained on the mask retaining section 14.

The intake port 51 may be disposed forward of the moving mask M. For example, the intake port 51 connected to the supply port 53 of the third inner side face 49A may be formed on the inner side face 42 of the first member 28, or may be formed on at least a part of the side face in the Y axis direction of the first member 28. In the same manner, the intake port 51 connected to the supply port 53 of the fourth inner side face 49B may be formed on the upper face 41 of the first member 28 or may be formed on at least a section of the side face in the Y axis direction of the first member 28.

Seventh Embodiment

A seventh embodiment will be described hereafter. In the description below, the constituent sections which are the same or equivalent to those described in the embodiment above are denoted by the same reference numerals and description thereof will be simplified or omitted.

Figure 12:
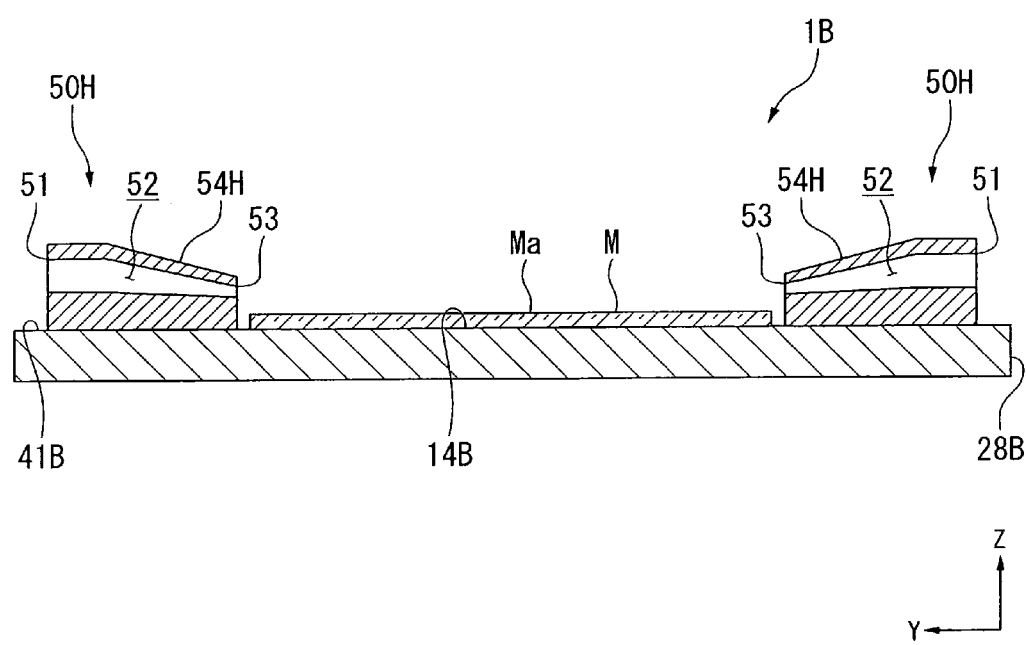
FIG. 12 shows an example of the mask stage according to a seventh embodiment.

In each embodiment described above, although an example was described in which the mask M is disposed on the recessed portion 40, as shown in FIG. 12, an intake structure 50H may be disposed on a first member 28B of a mask stage 1B not provided with a recessed portion. In FIG. 12, the upper face Ma of the mask M retained on a mask retailing section 14B of the first member 28B is disposed more on the +Z side than the upper face 41B of the first member 28B disposed on the periphery of the mask M. A nozzle member 54 of the intake structure 50H is disposed on the upper face 41B of the first member 28B. The intake structure 50H can suppress temperature increase in the mask M.

In each embodiment described above, although gas from the inner space 4 of the chamber apparatus 5 flowed into the intake structure, the invention is not limited in this regard and, for example, gas may be introduced from an air-conditioning device connected to the chamber apparatus 5 to the proximity of the mask stage for flow of that gas into the intake structure. In this case, the temperature of that gas may be set to a lower temperature than the temperature of the gas in the inner space 4. In this manner, the suppression effect on temperature increase can be improved.

In each embodiment described above, the intake structure may be mounted on the mask stage or at least a part of the intake structure may be integrated with the mask stage. Furthermore the mask stage is not limited to the arrangement above and may take an arbitrary arrangement.

In addition to a semiconductor wafer for use in production of semiconductor devices, the substrate P in each embodiment described above may be formed by a glass substrate for a display device, a ceramic wafer for magnetic thin film heads, or the original mask or reticle (synthetic quartz or silicon wafer) used in exposure apparatuses.

As for the exposure apparatus EX, in addition to a scan type exposure apparatus (scanning stepper) in which while synchronously moving the mask M and the substrate P, the pattern of the mask M is scan-exposed, a step-and-repeat type projection exposure apparatus (stepper) in which the pattern of the mask M is exposed at one time in the condition that the mask M and the substrate P are stationary, and the substrate P is successively moved stepwise can be used, moving In addition, in step-and-repeat system exposure, after a reduced image of a first pattern has been transferred onto the substrate P using a projection optical system in a status in which the first pattern and the substrate P have been made substantially stationary, a reduced image of the second pattern may be full-field exposed onto the substrate P so that it is partially superimposed with the first pattern using a projection optical system in a status in which the second pattern and the substrate P have been made substantially stationary (stitch system full-field exposure apparatus). In addition, for the stitch system full-field exposure apparatus, application to a step-and-stitch system exposure apparatus that partially superposes and transfers at least two patterns on the substrate P and sequentially moves the substrate P is also possible.

Furthermore it is possible to apply the present invention for example to an exposure apparatus as disclosed in the specification of U.S. Pat. No. 6,611,316 in which patterns from two masks can be combined on a substrate using a projection optical system and a single shot region on the substrate can be subjected to substantially simultaneous double exposure using a single burst of scan exposure light. Furthermore the present invention can be applied to proximity-type exposure apparatuses, mirror projection aligners and the like.

The present invention can be applied as an exposure apparatus EX to twin stage type exposure apparatuses provided with a plurality of substrate stages such as those disclosed in the specification of U.S. Pat. No. 6,341,007, the specification of U.S. Pat. No. 6,400,441, the specification of U.S. Pat. No. 6,549,269, the specification of U.S. Pat. No. 6,590,634, the specification of U.S. Pat. No. 6,208,407 and the specification of U.S. Pat. No. 6,262,796.

Furthermore the present invention can be applied to an exposure apparatus provided with a substrate stage retaining a substrate, a reference member forming a reference mark and/or a measuring stage mounting various types of photoelectric sensors as disclosed for example in the specification of U.S. Pat. No. 6,897,963, or the specification of European Patent Application Publication No. 1713113. Application of an exposure apparatus provided with a plurality of substrate stages and measuring stage is possible.

Application of the present invention is possible to an immersion exposure apparatus exposing a substrate with exposure light through a liquid as disclosed for example in PCT International Publication No. WO 99/49504. Furthermore application is possible to a EUV light source exposure apparatus exposing a substrate P with extreme ultra-violet light.

The type of exposure apparatus EX is not limited to an exposure apparatus used in the manufacture of semiconductor elements which exposes a semiconductor element pattern onto a substrate P but finds wide application to exposure apparatuses for the manufacture of liquid crystal display elements or displays, or exposure apparatuses for the manufacture of magnetic thin film heads, image sensors (CCD), micro-machines, MEMS, DNA chips or, reticles and masks.

In each embodiment described above, respective positional information of the substrate stage and the mask stage was measured using an interferometer system. However the present invention is not limited in this regard and for example may use an encoder system which detects the scale (diffraction grating) provided in each stage. In this case, a hybrid system provided with both an interferometer system and an encoder system is preferred so that the measurement results of the interferometer system can be used in order to calibrate the measurement results of the encoder system. Furthermore positional control of the stage may be performed by switching between the interferometer system and the encoder system or by using both.

in each of the above described embodiments, an ArF excimer laser is used as the light source apparatus which emits ArF excimer laser light for the exposure light EL, however, it is also possible to use, for example, a solid-state laser light source such as a DFB semiconductor laser or a fiber laser such as is disclosed in U.S. Pat. No. 7,023,610, or a higher harmonic wave generating apparatus which includes an optical amplification portion having a fiber amp or the like and a wavelength conversion portion, and which outputs pulse light having a wavelength of 193 nm. Furthermore, in the above described embodiments, both the respective illumination areas and the respective irradiation areas (i.e., projection areas) are each formed in a rectangular shape, however, it is also possible to use other shapes such as, for example, a circular arc shape or the like.

In the embodiments discussed above, a light transmitting type mask is used wherein a prescribed shielding pattern (or a phase pattern or a dimming pattern) is formed on a light transmitting substrate; however, instead of such a mask, a variable forming mask (also called an electronic mask, an active mask, or an image generator), wherein a transmittance pattern, a reflected pattern, or a light emitting pattern is formed based on electronic data of the pattern to be exposed, may be used as disclosed in, for example, U.S. Pat. No. 6,778,257. The variable forming mask comprises a digital micromirror device (DMD), which is one kind of non-emissive type image display device (spatial light modulator). In addition, the variable forming mask is not limited to a DMD, and a non-emissive type image display device, which is explained below, may be used instead. Here, the non-emissive type image display device is a device that spatially modulates the amplitude (the intensity), the phase, or the polarization state of the light that travels in a prescribed direction; furthermore, examples of a transmissive type spatial light modulator include a transmissive type liquid crystal display (LCD) as well as an electrochromic display (ECD). In addition, examples of a reflecting type spatial light modulator include a DMD, which was discussed above, as well as a reflecting mirror array, a reflecting type LCD, an electrophoretic display (EPD), electronic paper (or electronic ink), and a grating light valve.

When a deformable mask is retained on a mask retaining section, an intake structure and outlet structure as described with reference to each embodiment above may be used in order to suppress temperature change in the deformable mask.

Instead of a variable forming mask that is provided with a non-emissive type image display device, a pattern forming apparatus that comprises a self luminous type image display device may be provided. In this case, an illumination system is not necessary. Here, examples of a self luminous type image display device include a cathode ray tube (CRT), an inorganic electroluminescence display, an organic electroluminescence display (OLED: organic light emitting diode), an LED display, an LD display, a field emission display (FED), and a plasma display (PDP: plasma display panel). In addition, a solid state light source chip that has a plurality of light emitting points or that creates a plurality of light emitting points on a single substrate, a solid state light source chip array wherein a plurality of chips are arrayed, or the like may be used as the self luminous type image display device that constitutes the pattern forming apparatus, and the pattern may be formed by electrically controlling the solid state light source chip or chips. Furthermore, it does not matter whether the solid state light source device is inorganic or organic.

When this type of pattern formation device is retained on the retaining section, an inlet mechanism or an outlet structure as described in each of the above embodiments suppress temperature variation in the pattern formation device.

In each of the embodiments described above, an example was described of an exposure apparatus provided with a projection optical system PL. However the present invention may be applied to an exposure apparatus and a method of exposure not using a projection optical system PL. Even when a projection optical system PL is not employed, exposure light is illuminated on the substrate through an optical member such as a lens.

As described above, the exposure apparatus is manufactured by assembling various sub-systems including various constituent elements while maintaining predetermined mechanical accuracy, electrical accuracy and optical accuracy. In order to maintain these accuracy requirements, before and after assembly, adjustment for ensuring optical accuracy is performed on various optical systems, adjustment for ensuring mechanical accuracy is performed on various mechanical systems and adjustment to ensure electrical accuracy is performed on various electrical systems. The assembly step from the various sub-systems to an exposure apparatus includes mechanical connection, wiring connection of electrical circuits and piping connection for an air-pressure circuit between the various sub-systems. Before the assembly step from the various sub-systems to an exposure apparatus, there is obviously an assembly step of each individual sub-system. When the assembly step of each sub-system into an exposure apparatus is completed, overall adjustment is performed in order to maintain the respective accuracies of the overall exposure apparatus. The manufacture of an exposure apparatus should preferably be performed in a cleanroom with a controlled temperature and level of cleanliness.

Figure 13:
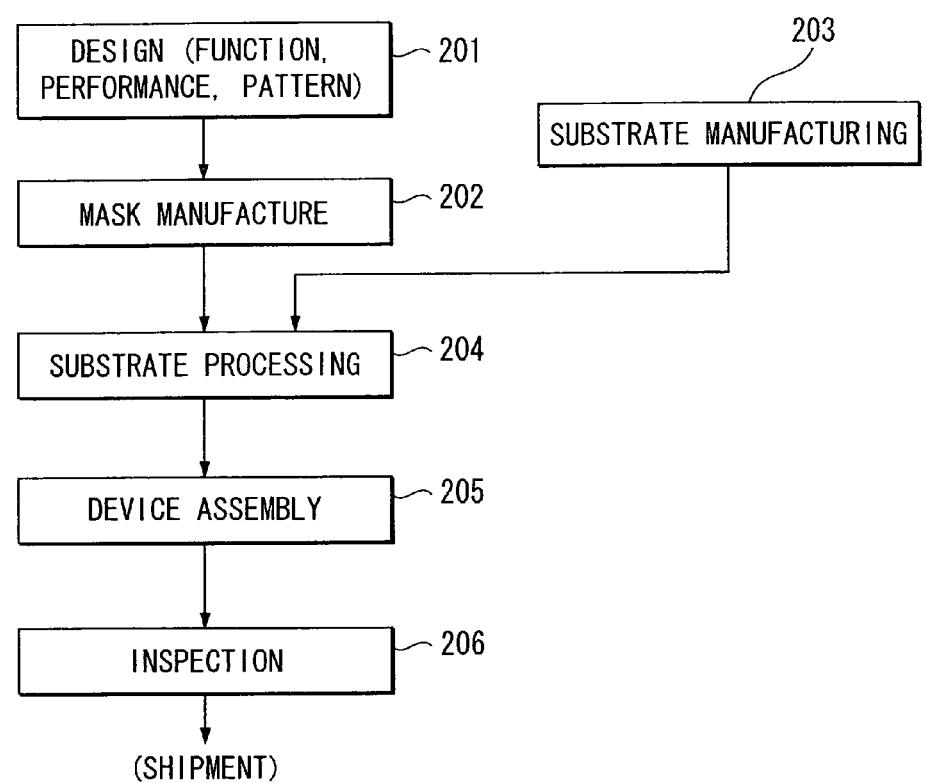
FIG. 13 is a flowchart showing an example of a manufacturing process for a micro-device.

As shown in FIG. 13, a micro-device such as a semiconductor device is manufactured by a step 201 of designing the performance and function of a micro-device, a step 202 of manufacturing a mask (reticle) based on the design step, a step 203 of manufacturing a substrate which is a backing for the device, a substrate processing step 204 which includes substrate processing in accordance with the embodiments above by exposing the substrate with exposure light through the mask and developing the exposed substrate, a device assembly step 205 (including processing such as a dicing step, bonding step, and packaging step) and a scanning step 206.

The necessary requirements for each embodiment above can be suitably combined. As far as is permitted, the disclosures in all of the documents and U.S. patents related to exposure apparatuses and the like cited in the above respective embodiments and modified examples, are incorporated herein by reference.

What is claimed is:

1. A stage device comprising:
    a chamber forming an inner space;
    a mobile member in the inner space and having a retaining section, which is configured to retain a mask illuminated with exposure light, the mobile member being configured to move along a predetermined plane including an illumination position of the exposure light when the retaining section retains the mask; and
    an intake structure in the inner space, the intake structure being configured to move due to the movement of the mobile member and having an intake port, a first gas passage, and a supply port, the intake port opening to the inner space, the intake port being configured to receive gas from the inner space at a periphery of the mask retained by the retaining section when the intake structure is moved, the first gas passage extending between the intake port and the supply port and through which the gas taken via the intake port flows, the flow of the gas being produced by the movement of the intake structure due to the movement of the mobile member, the supply port being configured to supply gas flowing from the first gas passage to a surface of the mask retained on the retaining section.

2. The stage device according to claim 1, wherein the intake structure is disposed on the mobile member.

3. The stage device according to claim 1, wherein the intake structure moves in synchrony with the mobile member.

4. The stage device according to claim 1, wherein the supply port is disposed at at least a part of a periphery of the retaining section.

5. The stage device according to claim 1, wherein the supply port is disposed at a position differing from the surface of the mask in a direction which is substantially perpendicular to the surface of the mask.

6. The stage device according to claim 1, wherein the supply port supplies gas from a direction oblique with respect to the surface of the mask.

7. The stage device according to claim 1, wherein the supply port is disposed lateral to the surface of the mask in the predetermined plane.

8. The stage device according to claim 1, wherein
    the mobile member has a first face disposed at a periphery of the retaining section and
    at least a part of the intake structure is disposed at a position opposite the first face.

9. The stage device according to claim 8, wherein the first face is substantially parallel to the surface of the mask retained on the retaining section.

10. The stage device according to claim 8, wherein the supply port is disposed farther from the surface of the mask than is the first face.

11. The stage device according to claim 8, wherein the surface of the mask retained on the retaining section is closer to the center of the mobile member than the first surface in a first direction substantially perpendicular to the predetermined plane.

12. The stage device according to claim 1, wherein the mobile member has a recessed portion and the retaining section is disposed in the recessed portion.

13. The stage device according to claim 12, wherein the surface of the mask retained on the retaining section is disposed inside the recessed portion.

14. The stage device according to claim 12, wherein
    the surface of the mobile member is disposed at the periphery of the recessed portion, and
    the surface of the mask is closer to the center of the mobile member than the surface of the mobile member in a direction which is substantially perpendicular to the surface of the mask retained on the retaining section.

15. The stage device according to claim 1, further comprising:
    a second face that is disposed outside the intake structure with respect to the retaining section and is illuminated with measuring light for measuring positional information of the mobile member.

16. The stage device according to claim 1, wherein the intake structure comprises a nozzle member on which the intake port, the first gas passage and the supply port are provided.

17. The stage device according to claim 16, wherein the nozzle member is fixed to a predetermined position with reference to the mobile member.

18. The stage device according to claim 16, further comprising:
a drive device that is capable of moving the nozzle member to adjust a positional relationship between the mobile member and the nozzle member.

19. The stage device according to claim 1, wherein the intake structure comprises a passage formation member that can form at least a part of the intake port, the first gas passage and the supply port with the mobile member.

20. The stage device according to claim 19, further comprising:
a drive device that can move the passage formation member to adjust the positional relationship between the mobile member and the passage formation member.

21. The stage device according to claim 1, wherein at least a part of the intake structure is formed in the mobile member.

22. The stage device according to claim 1, wherein
the mobile member moves in a second direction in the predetermined plane and
the intake port is disposed forward of the moving mask in the second direction.

23. The stage device according to claim 1, wherein
the mobile member moves in a second direction in the predetermined plane and
the intake structure is disposed respectively at both sides of the mask in the second direction.

24. The stage device according to claim 1, wherein the intake port is larger than the supply port.

25. The stage device according to claim 1, wherein the first gas passage gradually narrows from the intake port towards the supply port.

26. The stage device according to claim 1, wherein the supply port is formed as a slit with a width which is substantially equal to the mask or larger than the width of the mask.

27. The stage device according to claim 1, wherein the intake structure comprises a turbulence producing mechanism by which turbulence is produced in gas supplied from the supply port.

28. The stage device according to claim 27, wherein the turbulence producing mechanism comprises a plurality of minute members disposed on at least a part between the intake port and the supply port.

29. The stage device according to claim 27, wherein the turbulence producing mechanism comprises a porous member disposed at least a part between the intake port and the supply port.

30. The stage device according to claim 27, wherein the inflow port is disposed at at least a part of the periphery of the retaining section.

31. The stage device according to claim 1, wherein the supply port supplies gas towards a face other than the pattern forming face of the mask.

32. The stage device according to claim 1, wherein the supply port supplies gas toward the pattern forming face of the mask.

33. The stage device according to claim 1, further comprising:
an outlet structure that comprises an inflow port into which at least a part of the gas flowing over the surface of the mask flows, a second gas passage in which gas flowing from the inflow port flows, and an outlet port from which gas from the second gas passage flows out.

34. The stage device according to claim 33, wherein the outlet structure is disposed on the mobile member.

35. The stage device according to claim 33, wherein the outlet structure moves synchronously with the mobile member.

36. An exposure apparatus that illuminates a mask with exposure light and exposes a substrate with the exposure light via the mask, the exposure apparatus comprises the stage device according to claim 1.

37. A method of producing a device comprising
exposing a substrate using the exposure apparatus according to claim 36 and
developing the exposed substrate.

38. The stage device according to claim 1, wherein the gas flowing from the supply port to the surface of the mask is changed in response to a change of a moving direction of the mobile member.

39. The stage device according to claim 1,
wherein the intake structure includes a plurality of structures each having the intake port, the first gas passage and the supply port,
and wherein the intake ports of the structures are switched in response to a change of a moving direction of the mobile member.

40. A stage device comprising:
a chamber forming an inner space;
a mobile member in the inner space and having a retaining section, which is configured to retain a mask illuminated with exposure light, the mobile member being configured to move along a predetermined plane including an illumination position of the exposure light when the retaining section retains the mask; and
an outlet structure in the inner space, the outlet structure being configured to move due to the movement of the mobile member and having an inflow port opening to the inner space, the inflow port being configured to receive at least part of the gas flowing over the surface of the mask in the inner space when the outlet structure is moved, a gas passage in which gas from the inflow port flows, and an outlet port from which gas flowing from the gas passage flows out to the inner space at a periphery of the mask retained by the retaining section, the flow of the gas being produced by the movement of the outlet structure due to the movement of the mobile member, the gas passage extending between the inflow port and the outlet port.

41. The stage device according to claim 40, wherein the outlet structure is disposed on the mobile member.

42. The stage device according to claim 40, wherein the outlet structure moves in synchrony with the mobile member.

43. The stage device according to claim 40, wherein the inflow port is disposed at at least a part of the periphery of the retaining section.

44. The stage device according to claim 40, wherein the inflow port is disposed at a position differing from the surface of the mask in a direction which is substantially perpendicular to the surface of the mask.

45. The stage device according to claim 40, wherein the inflow port is disposed in a direction oblique with respect to the surface of the mask.

46. The stage device according to claim 40, wherein the inflow port is disposed lateral to the surface of the mask in the predetermined plane.

47. The stage device according to claim 40, wherein
the mobile member has a first face disposed at a periphery of the retaining section and
at least a part of the outlet structure is disposed at a position opposite the first face.

48. The stage device according to claim 47, wherein the first face is substantially parallel to the surface of the mask retained on the retaining section.

49. The stage device according to claim 47, wherein the inflow port is farther from the surface of the mask than is the first face.

50. The stage device according to claim 47, wherein the surface of the mask retained on the retaining section is closer to the center of the mobile member than the first surface in a first direction substantially perpendicular to the predetermined plane.

51. The stage device according to claim 40, wherein the mobile member has a recessed portion and the retaining section is disposed in the recessed portion.

52. The stage device according to claim 51 wherein the surface of the mask retained on the retaining section is disposed inside the recessed portion.

53. The stage device according to claim 51, wherein
the surface of the mobile member is disposed at the periphery of the recessed portion, and
the surface of the mask is closer to the center of the mobile member than the surface of the mobile member in a direction which is substantially perpendicular to the surface of the mask retained on the retaining section.

54. The stage device according to claim 40, further comprising:
a second face that is disposed outside the intake structure with respect to the retaining section, and is illuminated with measuring light for measuring positional information of the mobile member.

55. The stage device according to claim 54 wherein the outlet port discharges gas in a direction which is different to the path of measuring light.

56. The stage device according to claim 40, wherein the outlet structure comprises a nozzle member on which the inflow port, the gas passage and the outlet port are provided.

57. The stage device according to claim 56, wherein the nozzle member is fixed to a predetermined position with reference to the mobile member.

58. The stage device according to claim 56, further comprising:
a drive device that is capable of moving the nozzle member to adjust a positional relationship between the mobile member and the nozzle member.

59. The stage device according to claim 40, wherein the outlet structure comprises a passage formation member that can form at least a part of the intake port, the gas passage and the outlet port with the mobile member.

60. The stage device according to claim 40, farther comprising:
a drive device that can move the passage formation member to adjust the positional relationship between the mobile member and the passage formation member.

61. The stage device according to claim 40, wherein at least a part of the outlet structure is disposed on the mobile member.

62. The stage device according to claim 40, wherein
the mobile member moves in a second direction of the predetermined plane and
the intake port is disposed rearward of the moving mask in the second direction.

63. The stage device according to claim 40, wherein
the mobile member moves in a second direction of the predetermined plane and
the outlet structure is disposed respectively at both sides of the mask in the second direction.

64. The stage device according to claim 40, wherein the outlet port is larger than the inflow port.

65. The stage device according to claim 40, wherein the gas passage gradually widens from the inflow port towards the outlet port.

66. The stage device according to claim 40, wherein the inflow port is formed as a slit with a width which is substantially equal to the mask or larger than the width of the mask.

67. The stage device according to claim 40, wherein the gas flowing over the surface of the mask into the inflow port is changed in response to a change of a moving direction of the mobile member.

68. The stage device according to claim 40,
wherein the outlet structure includes a plurality of structures each having the inflow port, the gas passage and the outlet port,
and wherein the outlet ports of the structures are switched in response to a change of a moving direction of the mobile member.

69. A stage device comprising:
a mobile member having a retaining section, which is configured to retain a mask illuminated with exposure light, the mobile member being configured to move along a predetermined plane including an illumination position of the exposure light when the retaining section retains the mask, and
a passive airflow control structure attached to the mobile member so as to move due to the movement of the mobile member in a moving direction, the passive airflow control structure having an intake port, a first gas passage, and a supply port, the first gas passage extending along the moving direction between the intake port and the supply port such that when the passive airflow control structure is moved due to movement of the passive airflow control structure with the mobile member (1) gas is taken into the intake port, (2) the gas flows through the first gas passage, and then (3) the gas is supplied via the supply port to a surface of the mask retained on the retaining section, the flow of the gas being produced by the movement of the passive airflow control structure due to the movement of the mobile member.

70. A stage device comprising:
a mobile member having a retaining section, which is configured to retain a mask illuminated with exposure light, the mobile member being configured to move along a predetermined plane including an illumination position of the exposure light when the retaining section retains the mask, and
a passive airflow control structure attached to the mobile member so as to move due to the movement of the mobile member in a moving direction, the passive airflow control structure having an inflow port, a gas passage, and an outlet port, the gas passage extending along the moving direction between the inflow port and the outlet port such that when the passive airflow control structure is moved due to movement of the passive airflow control structure with the mobile member (1) at least part of the gas flowing over a surface of the mask flows into the inflow port, (2) the gas flows through the gas passage, and then (3) the gas flows out via the outlet port from the gas passage, the flow of the gas being produced by the movement of the passive airflow control structure due to the movement of the mobile member.

* * * * *